(12) United States Patent
Isobe et al.

(10) Patent No.: US 10,802,041 B2
(45) Date of Patent: Oct. 13, 2020

(54) ACCELERATION SENSOR

(71) Applicant: Hitachi, Ltd., Tokyo (JP)

(72) Inventors: Atsushi Isobe, Tokyo (JP); Yuudai Kamada, Tokyo (JP); Chisaki Takubo, Tokyo (JP); Noriyuki Sakuma, Tokyo (JP); Tomonori Sekiguchi, Tokyo (JP)

(73) Assignee: HITACHI, LTD., Tokyo (JP)

( * ) Notice: Subject to any disclaimer, the term of this patent is extended or adjusted under 35 U.S.C. 154(b) by 189 days.

(21) Appl. No.: 16/127,268

(22) Filed: Sep. 11, 2018

(65) Prior Publication Data

US 2019/0162752 A1 May 30, 2019

(30) Foreign Application Priority Data

Nov. 29, 2017 (JP) .................................. 2017-229212

(51) Int. Cl.
| | |
|---|---|
| *G01P 15/125* | (2006.01) |
| *G01P 15/08* | (2006.01) |
| *G01P 15/18* | (2013.01) |
| *G01H 11/06* | (2006.01) |

(52) U.S. Cl.
CPC ............ *G01P 15/125* (2013.01); *G01H 11/06* (2013.01); *G01P 15/0802* (2013.01); *G01P 15/18* (2013.01); *B81B 2201/0235* (2013.01); *G01P 2015/084* (2013.01); *G01P 2015/086* (2013.01)

(58) Field of Classification Search
CPC .... G01P 15/125; G01P 15/0802; G01P 15/18; G01P 2015/086; G01P 2015/084; G01P 2015/0808; G01P 2015/822; G01P 2015/0831; G01P 2015/0834; G01H 11/06; B81B 2201/0235
USPC .............. 73/514.32, 514.02, 514.18, 514.23, 73/514.24
See application file for complete search history.

(56) References Cited

U.S. PATENT DOCUMENTS

| | | | |
|---|---|---|---|
| 9,051,170 B2 * | 6/2015 | Huang ................ | G01R 33/0286 |
| 2011/0056295 A1 * | 3/2011 | Classen ..................... | B81B 7/02 73/514.32 |
| 2017/0341927 A1 * | 11/2017 | Pekka Herzogenrath .................... | G01C 19/5656 |

FOREIGN PATENT DOCUMENTS

| | | |
|---|---|---|
| WO | 2017/009885 A1 | 1/2017 |
| WO | 2017/046866 A1 | 3/2017 |

* cited by examiner

*Primary Examiner* — Robert R Raevis
(74) *Attorney, Agent, or Firm* — Mattingly & Malur, PC

(57) ABSTRACT

In an acceleration sensor detecting a vibration acceleration by using torsion of a beam joining a fixed portion and a membrane, a spring constant of the beam is decreased while an increase in a chip size due to extension of the beam is prevented, so that an acceleration sensor that is highly sensitive and small in a size is provided with a low price. A sensor of a capacitance detecting type includes a membrane having a stacking structure formed of two or more layers and a plurality of beams capable of twisting so that the membrane is movable in a detecting direction, a first beam of the plurality of beams is formed of the same layer as either an upper or a lower layer of the membrane, and a second beam thereof is formed of the same layer as either an upper or a lower layer of the movable portion.

7 Claims, 11 Drawing Sheets

ACCELERATION SENSOR

CROSS-REFERENCE TO RELATED APPLICATION

The present application claims priority from Japanese Patent Application No. 2017-229212 filed on Nov. 29, 2017, the content of which is hereby incorporated by reference into this application.

TECHNICAL FIELD OF THE INVENTION

The present invention relates to an acceleration sensor, and more particularly, relates to an acceleration sensor detecting a vibration acceleration.

BACKGROUND OF THE INVENTION

In the underground resources exploration field, the reflective elastic wave exploration using the acceleration sensor is performed. The reflective elastic wave exploration is a type of the geophysical exploration, and is a method to elucidate an underground structure by artificially generating seismic waves, capturing reflected waves bounced from the underground by using a geophone placed on ground surface, and analyzing the result.

In the reflective elastic wave exploration, elastic waves are excited from a vibrating source placed on the ground surface into the ground, and the elastic waves reflected on stratum boundary are received (sensed) by the geophone placed on the ground surface. The elastic waves excited in various directions propagate through the ground that increases damping, reflect on a plurality of strata, propagate through the ground that increases the damping again, scatter in a wide region, and return to the ground surface.

Therefore, in the acceleration sensor used for the reflective elastic wave exploration, it is required to detect an acceleration that is applied in a vertical direction, that is, the same direction as that of a gravity acceleration but is smaller than the gravity acceleration. That is, in the acceleration sensor used for the reflective elastic wave exploration, it is required to improve a sensitivity for the acceleration in the vertical direction.

As a background art of the present technical field, an International Publication No. WO2017/046866 (Patent Document 1) is exemplified. This publication document describes an acceleration sensor that has a membrane with a seesaw-type structure in which a plurality of beams allows motion of the membrane are connected to the membrane.

Also, an International Publication No. WO2017/009885 (Patent Document 2) describes an aspect of electric connection that can double the sensitivity when the acceleration sensor has four variable capacitances.

SUMMARY OF THE INVENTION

In order to improve the sensitivity for the acceleration in the acceleration sensor used for the reflective elastic wave exploration, a spring constant of the beam (torsion spring) is set to a small value. In order to obtain the small spring constant, a width of the beam (in an x-axis direction) may be narrowed, a thickness of the beam (in a z-axis direction) may be thinned, or a length of the beam (in a y-axis direction) may be lengthened.

However, in order to narrow the width of the beam (in the x-axis direction), an expensive manufacturing apparatus is necessary, and a manufacturing cost of the acceleration sensor increases. According to the Patent Document 1, the thickness of the beam (in the z-axis direction) is equalized to a thickness of the membrane, and therefore, cannot be thinned. Therefore, an approach for improving the sensitivity by lengthening the beam (in the y-axis direction) to decrease the spring constant is conceivable. However, when the beam becomes long, the chip size increases, and the manufacturing cost increases. Therefore, a highly sensitive acceleration sensor cannot be provided with a low price.

Therefore, it is required to achieve a highly sensitive acceleration sensor with a low price by achieving a beam having a small spring constant without narrowing the width of the beam (in the x-axis direction) but with the short beam (in the y-axis direction).

The above and other objects and novel characteristics of the present invention will be apparent from the description of the present specification and the accompanying drawings.

The summary of the typical aspects of the embodiments disclosed in the present application will be briefly described as follows.

The acceleration sensor according to one embodiment includes a membrane having a stacking structure and a plurality of beams capable of twisting so that the membrane is movable in a detecting direction in a capacitance detecting sensor, and a first beam of the plurality of beams is formed of the same layer as either an upper or a lower layer of the membrane while a second beam of the same is formed of the same layer as either an upper or a lower layer of a movable portion.

The effects obtained by the typical aspects of the present invention disclosed in the present application will be briefly described below.

According to the present invention, a performance of an acceleration sensor can be improved. Particularly, downsizing and high sensitivity of the acceleration sensor can be achieved.

BRIEF DESCRIPTIONS OF THE DRAWINGS

DESCRIPTIONS OF THE PREFERRED EMBODIMENTS

Hereinafter, embodiments of the present invention will be described in detail on the basis of the accompanying drawings. Note that components having the same function are denoted by the same reference symbols throughout all the drawings for describing the embodiments, and the repetitive description thereof will be omitted. In addition, the description of the same or similar portions is not repeated in principle unless particularly required in the following embodiments.

Also, in some drawings used in the embodiments, hatching is used even in a plan view so as to make the drawings easy to see.

<Reflective Elastic Wave Exploration Method>

First, the reflective elastic wave exploration using the acceleration sensor performed in the underground resources exploration field will be described. The reflective elastic wave exploration is a type of the geophysical exploration, and is a method to elucidate an underground structure by artificially generating seismic waves, capturing reflected waves bounced from the underground by using a geophone placed on ground surface, and analyzing the result.

Figure 19:
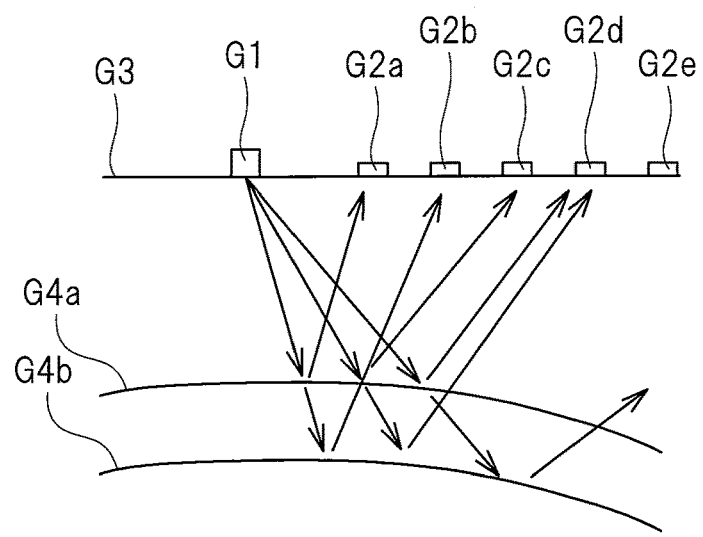
FIG. 19 is a cross-sectional schematic view of ground surface showing an outline of reflective elastic wave exploration.

FIG. 19 is a cross-sectional schematic view of ground surface showing an outline of the reflective elastic wave exploration.

As shown in FIG. 19, in the reflective elastic wave exploration, elastic waves are excited from a vibrating source G1 placed on the ground surface G3 into the ground, and the elastic waves reflected on either a stratum boundary G4a or G4b are received (sensed) by any of geophones G2a, G2B, G2c, G2d, and G2e placed on the ground surface G3. The acceleration sensor described in the following embodiments is used for the geophone G2a, G2B, G2c, G2d, or G2e. In FIG. 19, the elastic wave is indicated by an arrow.

The vibrating source G1 generates vibrations in a direction perpendicular to the ground surface G3, and therefore, P waves are efficiently excited in a direction that is almost the vertical direction. Therefore, in the reflective elastic wave exploration, the P waves are used. Also, since the elastic waves returning to the ground surface G3 again are P waves propagating from the direction that is almost the vertical direction, it is required to detect the elastic vibration of the vertical direction in the geophones G2a, G2b, G2c, G2d and G2e. The elastic waves excited in various directions propagate through the ground that increases the damping, reflect on a plurality of stratum boundaries G4a and G4b, propagate through the ground that increases the damping again, scatter in a wide region, and return to the ground surface G3.

In order to detect a small elastic vibration, it is required to use an acceleration sensor that is highly sensitive to the vibration of the vertical direction for each of the geophones G2a, G2b, G2c, G2d and G2e. Therefore, it is desirable to use an acceleration sensor of embodiments described below for the geophone G2a, G2b, G2c, G2d or G2e.

First Embodiment

<Structure of Acceleration Sensor of Present Embodiment>

A structure of the acceleration sensor according to the present first embodiment will be described with reference to FIGS. 1 to 8.

Figure 1:
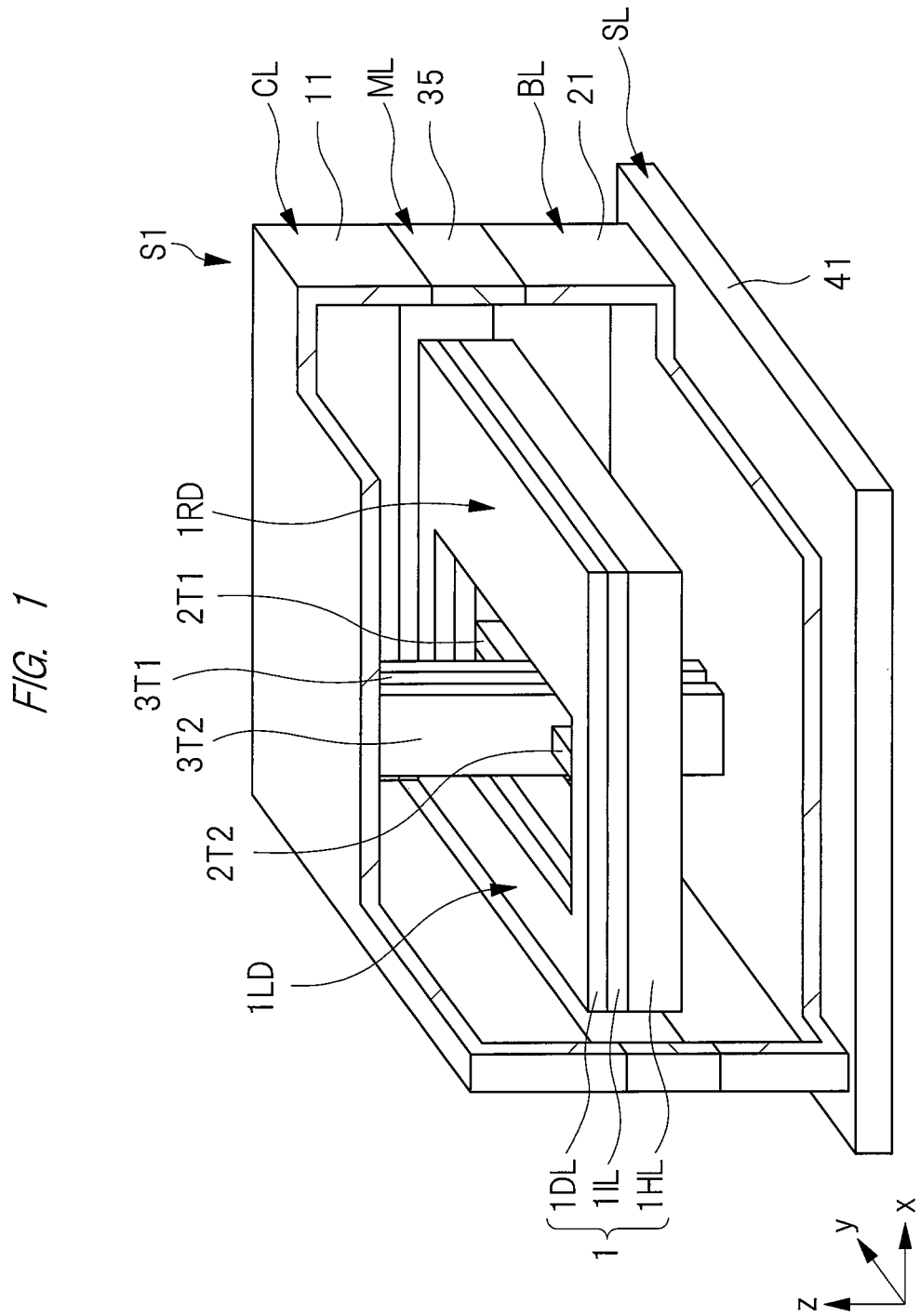
FIG. 1 is a perspective view showing an acceleration sensor according to a present first embodiment, apart of which is cut out.
Figure 2:
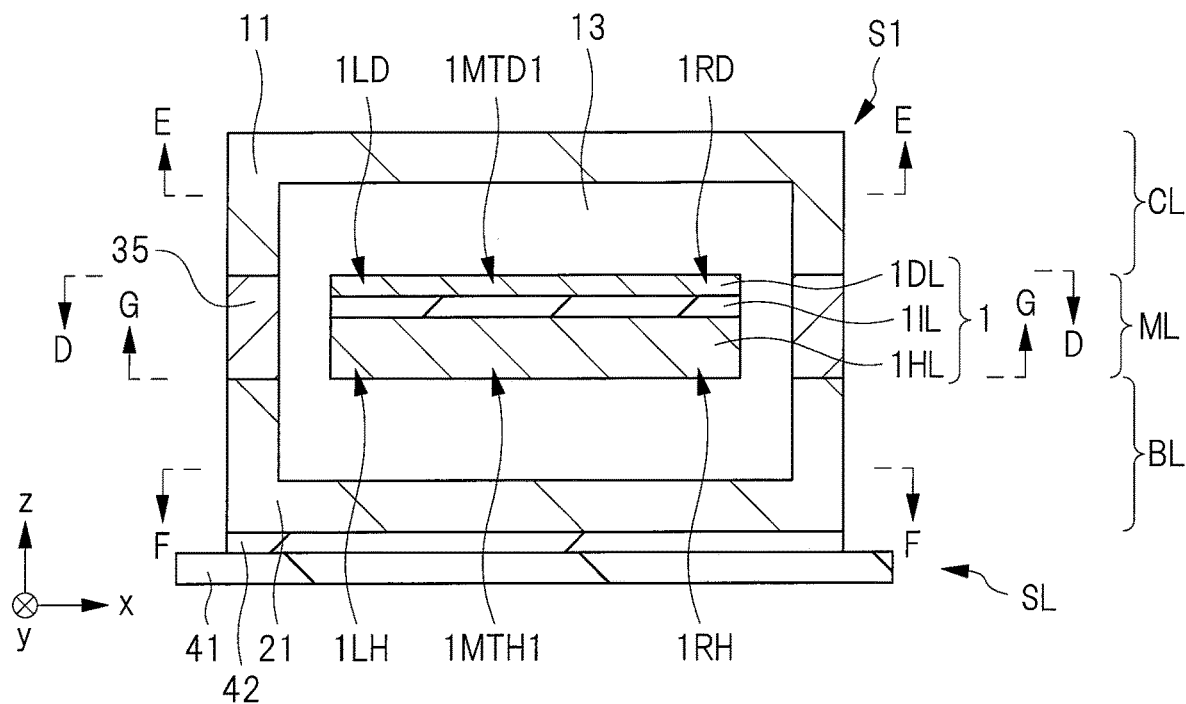
FIG. 2 is a cross-sectional view in a line A-A of each of FIGS. 5 to 8 in the view showing the acceleration sensor according to the present first embodiment.
Figure 3:
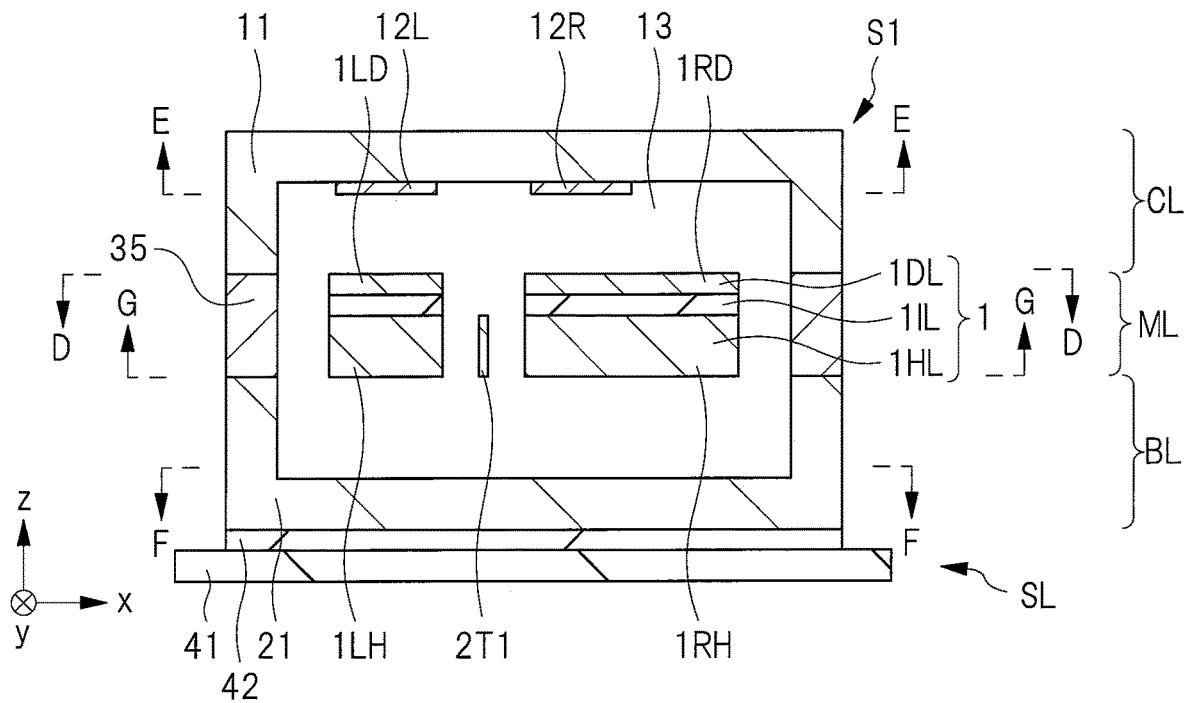
FIG. 3 is a cross-sectional view in a line B-B of each of FIGS. 5 to 8 in the view showing the acceleration sensor according to the present first embodiment.
Figure 4:
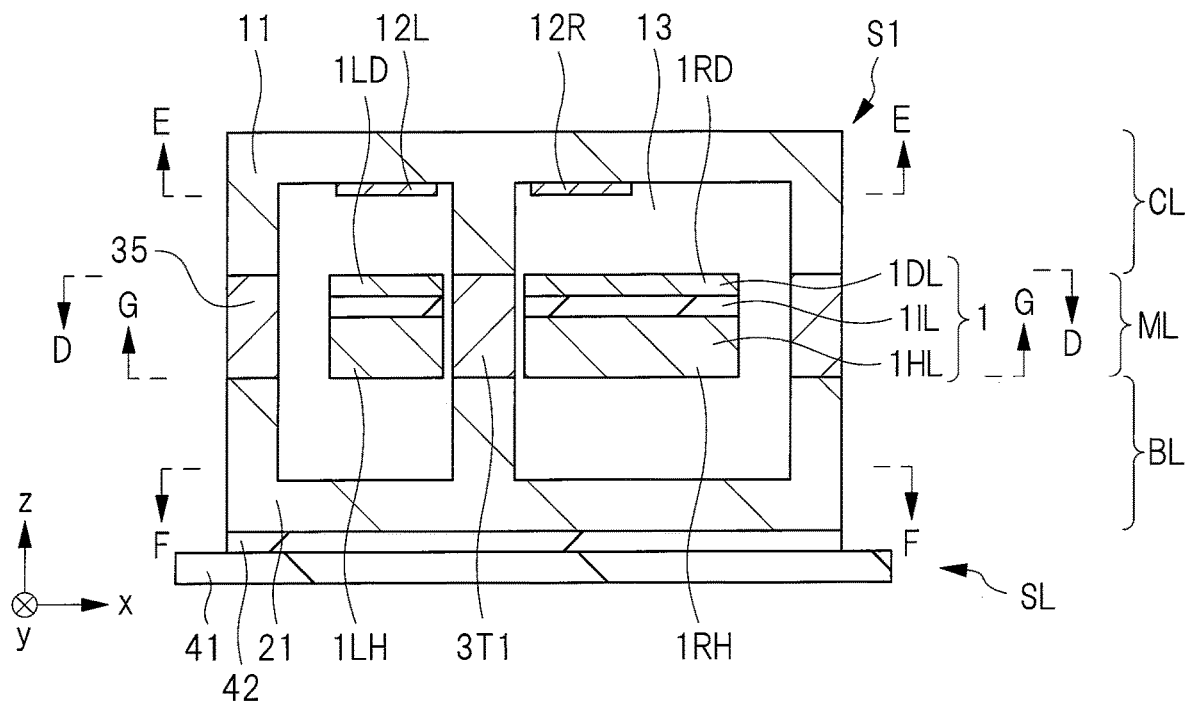
FIG. 4 is a cross-sectional view in a line C-C of each of FIGS. 5 to 8 in the view showing the acceleration sensor according to the present first embodiment.

FIG. 1 is a perspective view showing an acceleration sensor according to the present first embodiment, a part of which is cut out. Each of FIGS. 2 to 4 is a cross-sectional view of the acceleration sensor according to the present first embodiment. Each of FIGS. 5 to 8 is a plan view of the acceleration sensor according to the present first embodiment.

Figure 5:
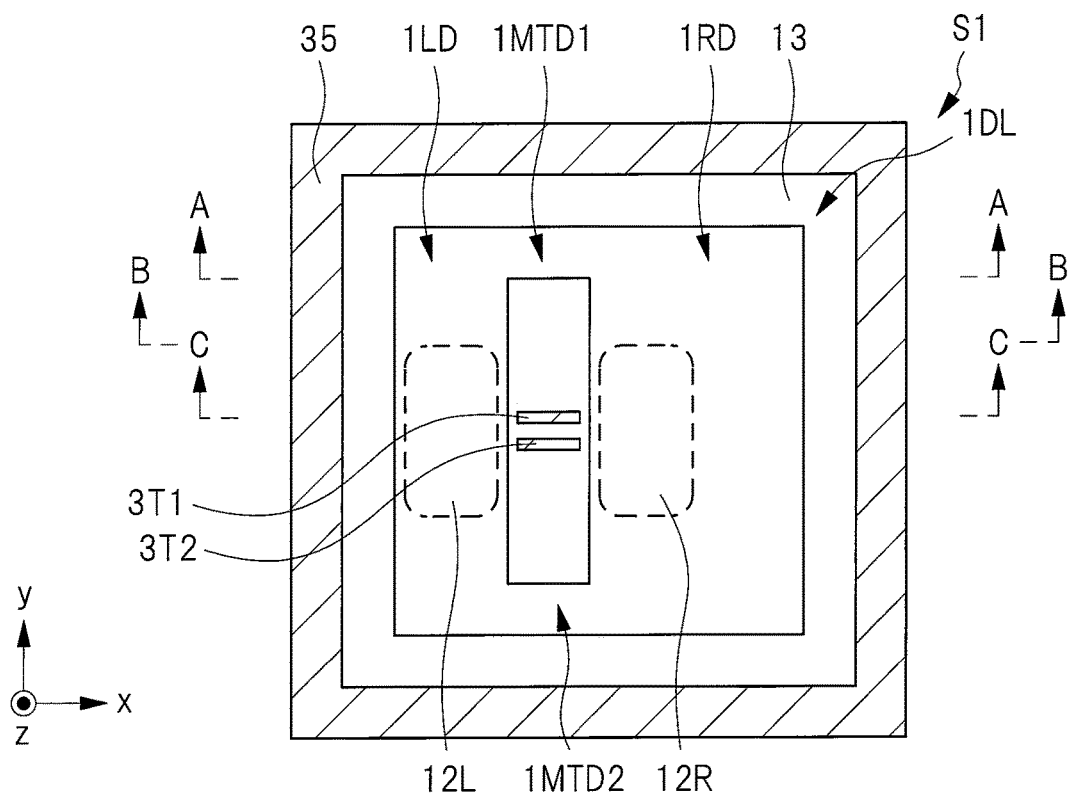
FIG. 5 is a plan view in a line D-D of each of FIGS. 2 to 4 in the view showing the acceleration sensor according to the present first embodiment.
Figure 6:
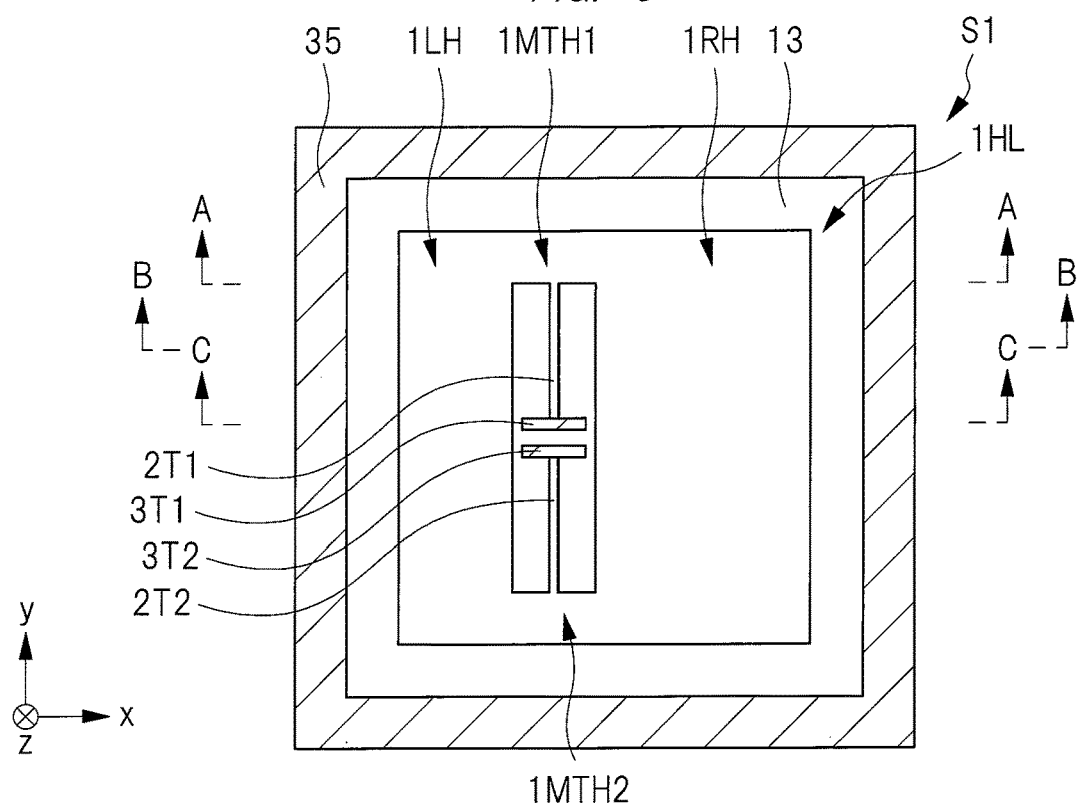
FIG. 6 is a plan view in a line G-G of each of FIGS. 2 to 4 in the view showing the acceleration sensor according to the present first embodiment.
Figure 7:
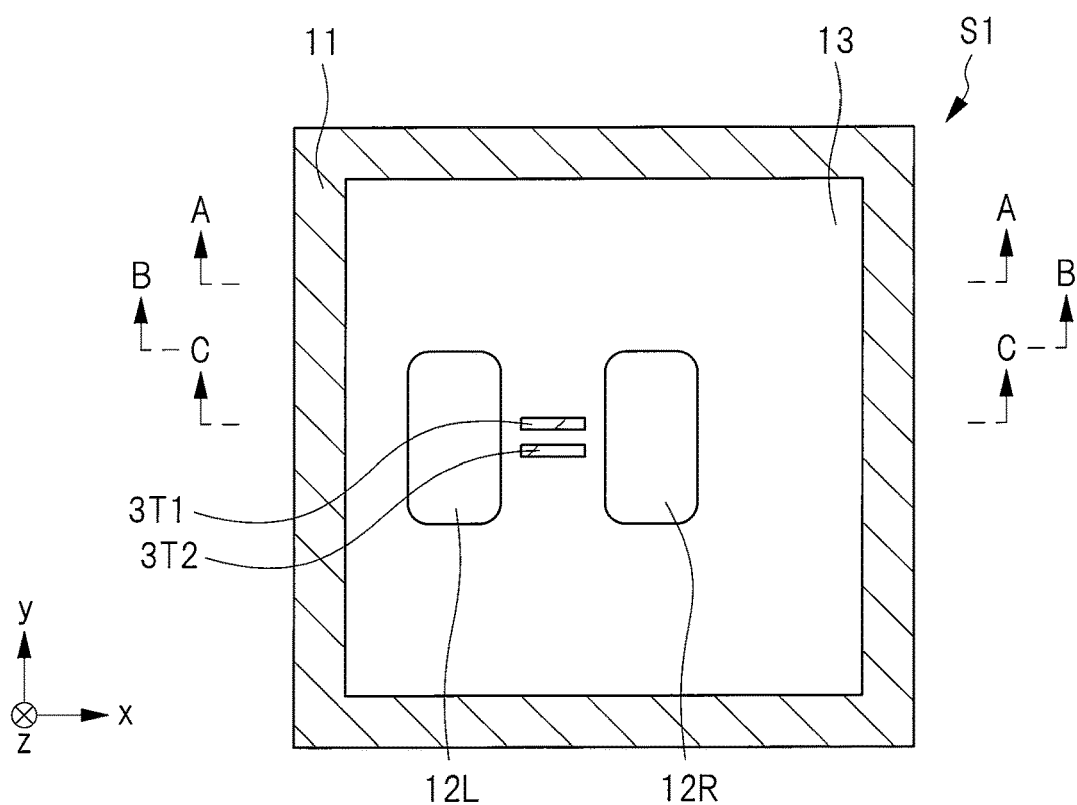
FIG. 7 is a plan view in a line E-E of each of FIGS. 2 to 4 in the view showing the acceleration sensor according to the present first embodiment.
Figure 8:
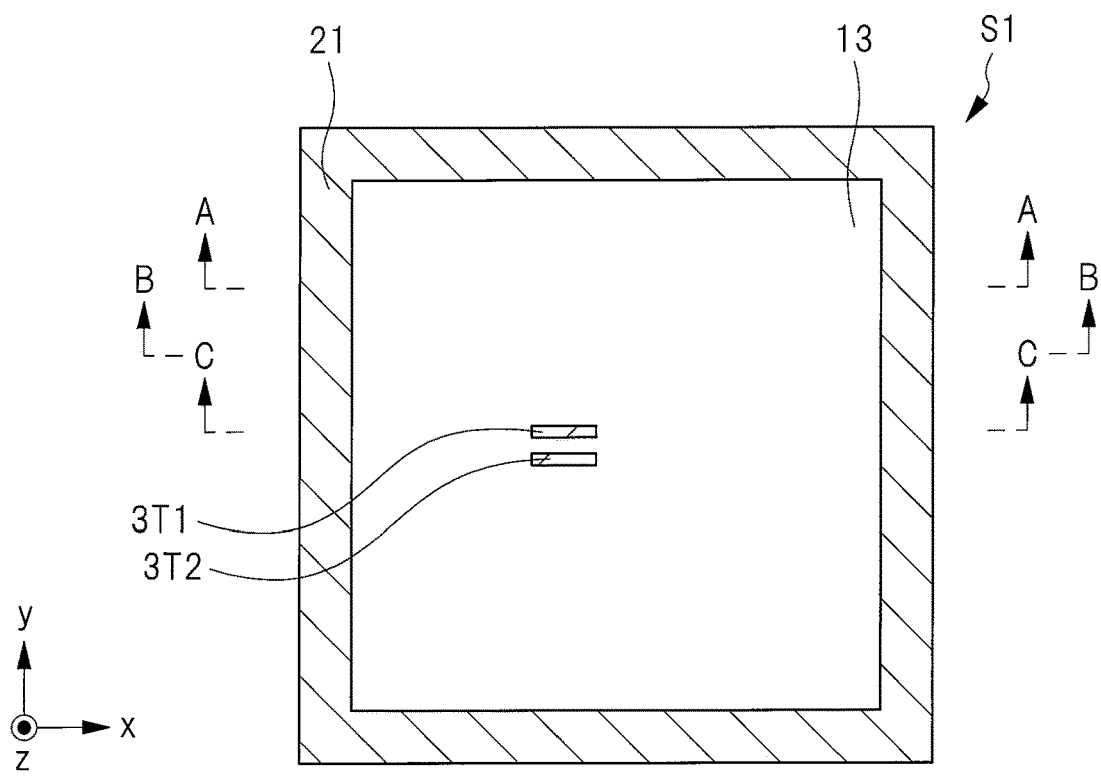
FIG. 8 is a plan view in a line F-F of each of FIGS. 2 to 4 in the view showing the acceleration sensor according to the present first embodiment.

FIG. 2 is a cross-sectional view in a line A-A of each of FIGS. 5 to 8. FIG. 3 is a cross-sectional view in a line B-B of each of FIGS. 5 to 8. FIG. 4 is a cross-sectional view in a line C-C of each of FIGS. 5 to 8. FIG. 5 is a plan view in a line D-D of each of FIGS. 2 to 4 in a plan view showing an upper surface of a membrane layer. FIG. 6 is a plan view in a line G-G of each of FIGS. 2 to 4 in a plan view showing a lower surface of the membrane layer. FIG. 7 is a plan view in a line E-E of each of FIGS. 2 to 4 in a plan view showing a lower surface of a cap layer. FIG. 8 is a plan view in a line F-F of each of FIGS. 2 to 4 in a plan view showing an upper surface of a base layer.

In FIG. 1, illustrations of two fixed electrodes on the membrane and an adhesive layer on an upper surface of an insulating layer that is a mounting substrate are omitted. In FIG. 5, a part where fixed electrodes 12L and 12R overlap each other in a plan view is illustrated with a broken line.

As shown in FIG. 1, an acceleration sensor S1 according to the present first embodiment is formed of a stacking structure of a base layer BL, a membrane layer ML, and a cap layer CL, and is mounted on a mounting substrate layer SL. The acceleration sensor S1 includes a container (outer frame) formed of the base layer BL, the cap layer CL and a side portion (outer wall portion) 35 connecting the base layer and the cap layer, and includes a membrane (mass body) 1 connected to fixed portions 3T1 and 3T2 through torsion springs (beams) 2T1 and 2T2, the fixed portions being two pillars fixed into the container. The membrane 1 is arranged so as to float inside the container. The torsion springs 2T1 and 2T2 join the membrane 1 to the fixed portions 3T1 and 3T2.

In the following description, it is assumed that two directions that cross each other, more preferably are orthogonal to each other in a plan view, are an x-axis direction and a y-axis direction, and a direction that is perpendicular to a main surface of the mounting substrate layer SL is a z-axis direction. And, the term "in a plan view" means a case of view from the z-axis direction or a "−" z-axis direction that is the direction perpendicular to the upper surface serving as the main surface of the mounting substrate layer SL. A thickness (film thickness) described in the present specification indicates a distance in the z-axis direction from an upper end of an object such as a layer to a lower end thereof. Note that each of FIGS. 6 and 7 is a plan view (bottom view) of the acceleration sensor S1 viewed from a bottom side, and always shows a structure in a positive direction of the y-axis direction to be on an upper side of a drawing and a structure in a negative direction of the y-axis direction to be on a lower side of the drawing as similar to a plan view (top view) of the acceleration sensor S1 viewed from a top side. That is, it can be said that FIGS. 6 and 7 reverse in the y-axis direction. This is similarly said in plan views shown in FIGS. 13, 15 and 18 described later.

As shown in FIGS. 2 to 4 and 7, the cap layer CL is formed of an insulating layer 11, a hollow 13, and fixed electrodes 12L and 12R. The insulating layer 11 has a concave portion formed on its lower surface in parts other than joint portions between the insulating layer and the side portion 3S of the membrane layer ML and between the insulating layer and the fixed portions 3T1 and 3T2 (see FIG. 5). The hollow 13 exists inside the concave portion, and the fixed electrodes 12L and 12R are arranged on an upper surface of the concave portion, that is, a lower surface of the insulating layer 11. The insulating layer 11 is arranged above the membrane layer ML, and functions as a cap closing the hollow 13. The fixed electrodes 12L and 12R are paired with two movable portions (movable electrodes) 1LD and 1RD, respectively, that are formed in the membrane layer ML and that are displaced in an opposite direction so as to function as the fixed electrodes of variable capacitances.

The fixed electrodes 12L and 12R are arranged right above the membrane 1. More specifically, the fixed electrode 12L is arrange right above the movable portion 1LD configuring the membrane 1, and the fixed electrode 12R is arrange right above the movable portion 1RD configuring the membrane 1. The fixed electrodes 12L and 12R are side by side in the x-axis direction so as to sandwich the fixed portions 3T1 and 3T2 in a plan view.

As shown in FIGS. 2 to 6, the membrane layer ML is formed of the membrane (mass body) 1, the torsion springs 2T1 and 2T2, the fixed portions 3T1 and 3T2 and the side portion 3S. The side portion 3S functions as a sidewall closing the hollow 13.

The membrane 1 is formed of a conductive layer 1HL, an insulating layer 1IL and a conductive layer 1DL that are stacked in this order from the bottom side (on a side closer to the insulating layer 41). Each of the conductive layer 1HL and the conductive layer 1DL is formed of, for example, a Si (silicon) layer, and the insulating layer 1IL is formed of, for example, a silicon oxide layer. A thickness of the conductive layer 1HL is, for example, 380 μm, a thickness of the insulating layer 1IL is, for example, 1 μm, and a thickness of the conductive layer 1DL is, for example, 60 μm.

The conductive layer 1DL is formed of movable portions 1LD and 1RD and joint portions 1MTD1 and 1MTD2 that mechanically and electrically connect the movable portions 1LD and 1RD, the conductive layer 1HL is formed of movable portions 1LH and 1RH and joint portions 1MTH1 and 1MTH2 that mechanically and electrically connect the movable portions 1LH and 1RH, and all the members are mechanically united. The movable portions 1LD and 1RD and the joint portions 1MTD1 and 1MTD2 are connected to one another to cause a circular plan layout. Similarly, the movable portions 1LH and 1RH and the joint portions 1MTH1 and 1MTH2 are connected to one another to cause a circular plan layout. That is, the membrane 1 has a circularly-formed rectangular plan layout having an opening portion at its nearly center.

The movable portions 1LD and 1RD are paired with the fixed electrodes 12L and 12R formed in the cap layer CL so as to function as movable electrodes of the variable capacitances. The movable portions 1LH and 1RH function as reinforcing members enhancing a mechanical strength of the membrane 1.

Note that a plurality of opening portions (hole portions) protruding the conductive layer 1DL, the insulating layer 1IL and the conductive layer 1HL in the z-axis direction are formed in these layers in some cases. This is for preventing motion of the membrane 1 from being blocked by a gas inside the acceleration sensor S1 when the membrane 1 moves inside the acceleration sensor S1. The acceleration sensor S1 of the present embodiment has the effect regardless of the plurality of opening portions, and therefore, the openings are omitted in the following description and drawings.

Each of the conductive layers 1DL and 1HL has a function of increasing a mass of the membrane 1. Therefore, the membrane 1 itself functions as a mass body. That is, in the vibration of the entire acceleration sensor S1, the membrane 1 seesaws when one side of the membrane 1 in the x-axis direction has a biased mass. At this time, change of a value of the variable capacitance is detected, so that the elastic vibration can be detected. Since a width of the movable portion 1RH in the x-axis direction is larger than a width of the movable portion 1LH in the x-axis direction, a center of gravity of the membrane 1 is positioned closer to the movable portion 1RH in the x-axis direction than a rotary axis on which the torsion springs 2T1 and 2T2 are side by side in a plan view. In this manner, in the vibration of the entire acceleration sensor S1, the membrane 1 seesaws. In the acceleration sensor S1 according to the present first embodiment, a width of the movable portion 1RD in the x-axis direction is larger than a width of the movable portion 1LD in the x-axis direction.

Although omitted in the drawings, an electric draw-out line is arranged in each of the fixed electrodes 12L and 12R functioning as one electrode of a variable capacitance, and is electrically connected to outside of the acceleration sensor S1. Similarly, an electric draw-out line is arranged also in each of the movable portions (movable electrodes) 1LD and 1RD functioning as the other electrode of the variable capacitance, and is electrically connected to outside of the acceleration sensor S1.

In the acceleration sensor S1 according to the present first embodiment, each of the torsion springs 2T1 and 2T2 and the fixed portions 3T1 and 3T2 is made of a conductor. In order to electrically connect the movable portions (movable electrodes) 1LD and 1RD and the movable portions (movable electrodes) 1LH and 1RH, a plurality of through conductors (not shown in the drawings) are formed in the insulating layer 1IL. Therefore, the torsion springs 2T1 and 2T2 and the fixed portions 3T1 and 3T2 also function as electric draw-out lines of the movable portions (movable electrodes) 1LD and 1RD. Note that the acceleration sensor S1 having two fixed portions 3T1 and 3T2 that are separated from each other is described in the present embodiment.

However, the torsion springs 2T1 and 2T2 may be connected to both sides of one fixed portion (pillar). This is because all the electrodes of the membrane 1 of the present embodiment are united so that it is not required to arrange the plurality of fixed portions (pillars) as a plurality of electric draw-out lines.

As shown in FIGS. 3, 5 and 6, each of the torsion springs 2T1 and 2T2 is formed of the conductive layer 1HL. In other words, each of the torsion springs 2T1 and 2T2 is formed of the same layer as the conductive layer 1HL.

Each of the torsion springs 2T1 and 2T2 has a plate shape that is thin in the x-axis direction (as the width) and long in the y-axis direction (as the length), and functions as the torsion spring that allows torsion motion taking the y axis as a rotary axis. Further, one ends of the torsion springs 2T1 and 2T2 in the y-axis direction are connected to the joint portions 1MTH1 and 1MTH2 that are a part of the lower layer of the membrane 1, and the other ends thereof are connected to the fixed portions 3T1 and 3T2, respectively. That is, both the torsion springs 2T1 and 2T2 are united with the conductive layer 1HL. The torsion spring 2T1 is united with the fixed portion 3T1, and the torsion spring 2T2 is united with the fixed portion 3T2. Therefore, each of the torsion springs 2T1 and 2T2 has a function that allows the torsion motion taking the y axis as the rotary axis with respect to the membrane 1. Further, each of the torsion springs 2T1 and 2T2 is set so that the length in the y-axis direction and the thickness in the z-axis direction are larger than the width in the x-axis direction, and therefore, the membrane 1 also has a function of suppressing rotary motion and translatory motion taking the y axis as the rotary axis except for the torsion motion.

Here, the conductive layer 1HL is five or more times thicker than the conductive layer 1DL, and therefore, the torsion springs 2T1 and 2T2 can strongly particularly suppress the rotary motion and the translatory motion taking the y axis as the rotary axis except for the torsion motion. Note that the insulating layer 1IL is thinner enough than the conductive layers 1DL and 1HL. For example, the thickness of the insulating layer 1IL is ⅕ times or smaller than the thickness of the conductive layer 1DL. Therefore, the existence of the insulating layer 1IL hardly affects the mechanical behavior of the membrane 1.

Since the torsion springs 2T1 and 2T2 are united with the conductive layer 1HL, each of the torsion springs 2T1 and 2T2 has the same thickness as that of the conductive layer 1HL. On the other hand, the insulating layer 1IL and the conductive layer 1DL are not formed right above the torsion springs 2T1 and 2T2. Therefore, each of the torsion springs 2T1 and 2T2 is smaller than the thickness of the membrane 1.

As shown in FIGS. 3, 7 and 8, the fixed portions 3T1 and 3T2 are mechanically strongly connected to the cap layer CL and the base layer BL, and function as the fixed portions that mechanically fix the ends of the torsion springs 2T1 and 2T2. Also, the fixed portions 3T1 and 312 also function as reinforcing members enhancing the mechanical strength of the insulating layer 11 of the cap layer CL.

As shown in FIGS. 2 to 4 and 8, the base layer BL is formed of an insulating layer 21 and a hollow 13. The insulating layer 21 has a concave portion on its upper surface in a part other than the joint portions between the insulating layer and the side portion 35 of the membrane layer ML and the joint portion between the insulating layer and the fixed portions 311 and 3T2 (see FIG. 5). Inside the concave portion, the hollow 13 exists. The insulating layer 21 is arranged below the membrane layer ML, and functions as a bottom portion closing the hollow 13. The insulating layer 21 also functions as a portion mechanically joined to the mounting substrate layer SL.

The mounting substrate layer SL is formed of an insulating layer 41 and an adhesive layer 42 formed on an upper surface of the insulating layer 41. The insulating layer 41 is a substrate on which the acceleration sensor S1 is mounted, such as a package, a circuit board, or a mother board made of a resin or a ceramic. The adhesive layer 42 functions as an adhesive member that mechanically joins the acceleration sensor S1 to the insulating layer 41.

Each of the insulating layers 11 and 21 is made of a material having a large resistance value such as a glass or a high-resistive silicon. Each of the insulating layers 11 and 21 is not required to be made of an insulator, and may be made of a material having a small resistance value such as a metal or a low-resistive silicon. However, in that case, it is required to form an insulating layer between the insulating layer 11 and the fixed electrodes 12L and 12R in order to electrically insulating the insulating layer 11 from the fixed electrodes 12L and 12R. In other words, it is required to form the insulating layer that separates the insulating layer 11 in apart connected to the fixed electrode 12L from the insulating layer 11 in a part connected to the fixed electrode 12R.

Each of the conductive layers 1DL and 1HL is made of a material having a small resistance value such as a metal (for example, Al (aluminum) or Au (gold)) or a low-resistive silicon. When the movable portions 1LD and 1RD are formed by hollowing a part of the conductive layer 1DL, the thickness of the movable portion 1LD and the thickness of the movable portion 1RD can be equalized with each other, and therefore, an accuracy of the acceleration sensor S1 can be increased. Similarly, when the movable portions 1LH and 1RH and the torsion springs 2T1 and 2T2 are formed by hollowing a part of the conductive layer 1HL, the thicknesses of the movable portions 1LH and 1RH and the thicknesses of the torsion springs 2T1 and 2T2 can be equalized with each other, and therefore, the accuracy of the acceleration sensor S1 can be increased.

Further, when the membrane 1 is formed by, for example, hollowing an SOI (Silicon On Insulator) substrate, the thickness of the insulating layer 1IL can be evenly formed, and therefore, the accuracy of the acceleration sensor S1 can be further increased. Note that the membrane 1, the side portion 35 and the fixed portions 3T1 and 3T2 are formed by processing the same stacking body as one another, and therefore, the side portion 35 and the fixed portions 3T1 and 3T2 practically have a stacking structure of the conductive layer, the insulating layer and the conductive layer in this order as similar to the membrane 1. However, here, illustration of such a stacking structure of the side portion 35 and the fixed portions 3T1 and 3T2 is omitted.

<Effect of Acceleration Sensor of Present Embodiment>

Figure 20:
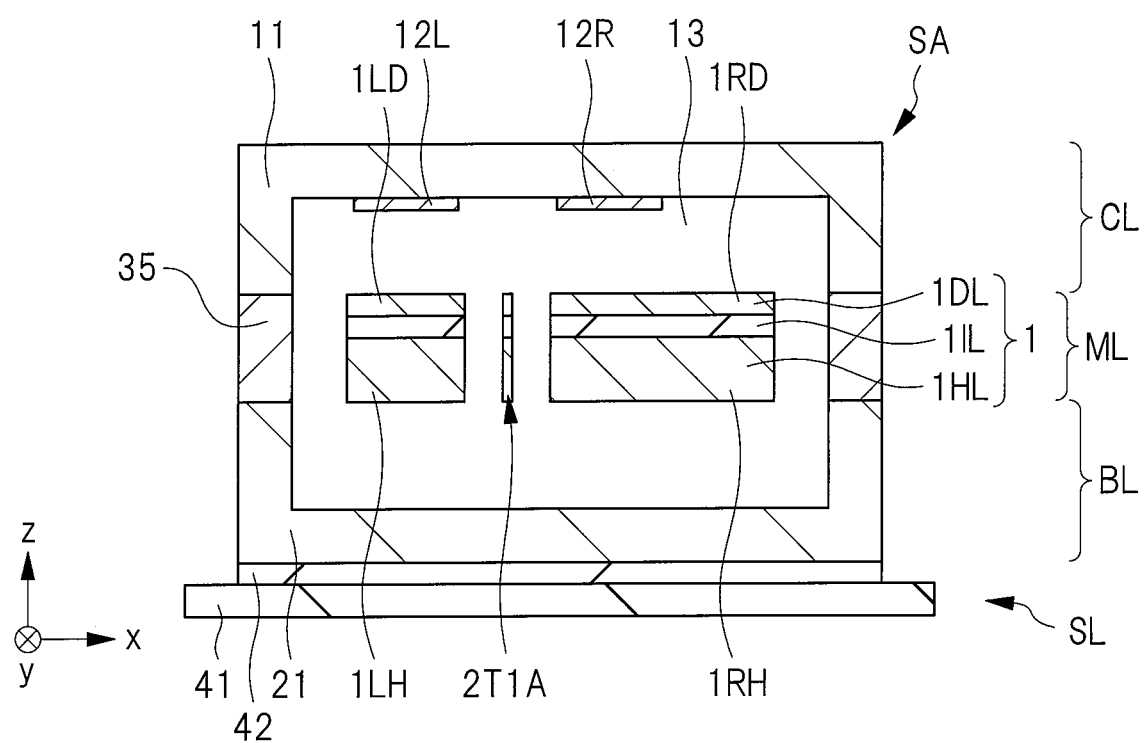
FIG. 20 is a cross-sectional view of an acceleration sensor according to a comparative example.

The following is explanation about an effect of the acceleration sensor of the present embodiment in comparison with FIG. 20 showing an acceleration sensor of a comparative example. FIG. 20 is a cross-sectional view showing the acceleration sensor of the comparative example, which shows a cross section of a part corresponding to FIG. 3. An acceleration sensor SA of the comparative example shown in FIG. 20 is the same as that of the present embodiment in that the acceleration sensor includes the membrane 1 having the stacking structure but different from the present embodiment in that a torsion spring 2T1A is formed of a stacking film of the conductive layer 1HL, the insulating layer 1IL and the conductive layer 1DL. In the comparative example, each of other torsion springs not illustrated is also formed of the same stacking film. That is, each of all the torsion springs (beams) has the same thickness as that of the membrane 1.

In the acceleration sensor used for the reflective elastic wave exploration, the spring constant of the beam is set to a small value in order to improve the sensitivity for the acceleration. In order to obtain the small spring constant, the width of the beam (in the x-axis direction) may be narrowed, the thickness of the beam (in the z-axis direction) may be thinned, or the length of the beam (in the y-axis direction) may be lengthened.

However, in order to narrow the width of the beam (in the x-axis direction), an expensive manufacturing apparatus is necessary, and a manufacturing cost of the acceleration sensor increases. When the thickness of the torsion spring (beam) 2T1A is equalized with the thickness of the membrane 1 as seen in the comparative example, the thickness of the beam (in the z-axis direction) cannot be thinned. Therefore, an approach for improving the sensitivity by lengthening the beam (in the y-axis direction) to decrease the spring constant is conceivable. However, when the beam becomes long, a chip size increases, and the manufacturing cost of the acceleration sensor increases. Therefore, there is such a problem that a highly sensitive acceleration sensor cannot be provided with a low price.

On the other hand, in the present embodiment, each of the torsion springs 2T1 and 2T2 is formed of only the conductive layer 1HL as shown in FIGS. 3, 5 and 6. Therefore, each thickness of the torsion springs 2T1 and 2T2 can be made smaller than the thickness of the membrane 1 formed of the stacking film of the conductive layer 1HL, the insulating layer 1IL and the conductive layer 1DL. That is, the beam having the small spring constant is achieved without narrowing the width of the beam (in the x-axis direction) and without lengthening the length of the beam (in the y-axis direction) but with thinning the thickness of the beam (in the z-axis direction).

Therefore, the acceleration sensor (chip) S1 can be microfabricated by the achievement of the short beam in the y-axis direction, and the sensitivity of the acceleration sensor S1 can be increased by the decrease in the spring constant of the beam, and therefore, the performance of the acceleration sensor can be improved. Also, by the achievement of such a high sensitivity with the prevention of the size increase of the acceleration sensor (chip) S1, the manufacturing cost of the acceleration sensor decreases, and therefore, the highly sensitive acceleration sensor can be provided with a low price.

Each of the torsion springs 2T1 and 2T2 is formed of the conductive layer 1HL, and can be formed to have the even thickness, and therefore, the accuracy of the acceleration sensor S1 can be increased. Further, when the membrane 1 is formed by, for example, hollowing the SOI (Silicon On Insulator) substrate, each of the torsion springs 2T1 and 2T2 can be formed of a handle layer to have the even thickness, and therefore, the accuracy of the acceleration sensor S1 can be further increased.

The above description will be expressed in other words as follows. That is, the acceleration sensor S1 according to the present first embodiment includes a capacitance detecting acceleration sensor including a membrane having a stacking structure of an upper layer and a lower layer and having a plurality of movable portions, a plurality of fixed portions, and a plurality of beams that join the fixed portion and the membrane and that can twist so that each of the plurality of movable portions is movable in the detecting direction. Each of the beams is a torsion spring having a width that is smaller than a thickness and having a length that is larger than the thickness, a first beam of the plurality of beams is formed of the same layer as either the upper layer or the lower layer, and a second beam thereof is formed of the same layer as either the upper layer or the lower layer. In this manner, the spring constant in the entire membrane can be decreased, and therefore, the length of the beam in the y-axis direction can be decreased, so that the chip size can be downsized. In other words, the highly sensitive acceleration sensor can be provided with a low price.

Modification Example

Figure 9:
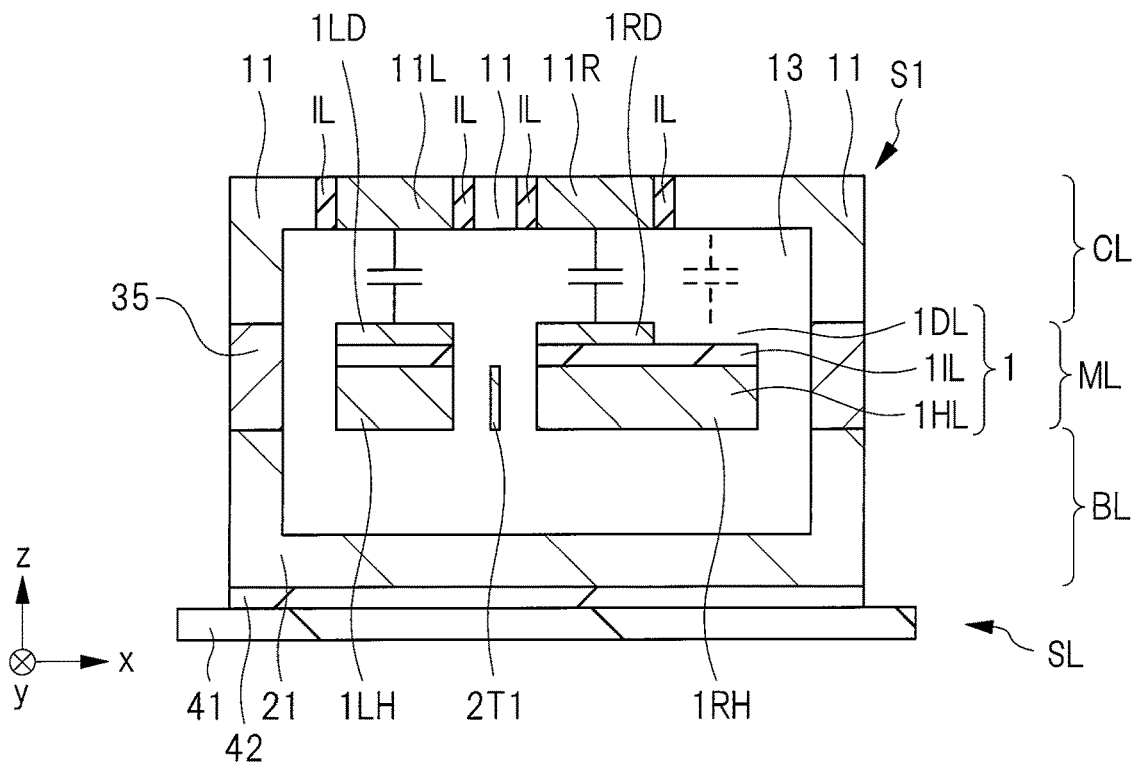
FIG. 9 is a cross-sectional view of an acceleration sensor according to a modification example of the present first embodiment.

FIG. 9 shows a cross-sectional view of an acceleration sensor according to a modification example of the present first embodiment. FIG. 9 shows a cross section of a part corresponding to FIG. 3.

The acceleration sensor of the present modification example is different from the acceleration sensor described with reference to FIGS. 1 to 8 in that the width of the movable portion 1RD in the x-axis direction has the same size as the width of the movable portion 1LD in the x-axis direction and in that the fixed electrode is formed of a part of the insulating layer 11 instead of usage of the fixed electrodes 12L and 12R (see FIG. 3).

As shown in FIG. 3, in some cases, it is practically difficult to form the fixed electrodes 12L and 12R connected to the bottom surface of the insulating layer 11. In these cases, an approach of formation of the fixed electrode 11R facing the movable portion 1RD and the fixed electrode 11L facing the movable portion 1LD inside the insulating layer 11 as shown in FIG. 9 is conceivable. Each of the fixed electrodes 11L and 11R is a region where the resistance of the insulating layer 11 made of Si (silicon) is decreased, and the fixed electrodes 11L and 11R are insulated from each other by the insulating layer IL penetrating the insulating layer 11.

In the present modification example, the width of the movable portion 1RD in the x-axis direction and the width of the movable portion 1LD in the x-axis direction are the same as each other, and areas of the movable portions 1RD and 1LD are the same as each other. This is for preventing the decrease in the sensitivity of the acceleration sensor due to a parasitic capacitance between an end of the movable portion 1RH and the insulating layer 11 as shown with a broken line when the vibration is detected by only the variable capacitance between the movable portions 1RD and 1LD and the fixed electrodes 11L and 11R as shown with a solid line in FIG. 9. That is, when the width of the movable portion 1RD is made larger than the width of the movable portion 1LD in accordance with the large width of the movable portion 1RH, there is a risk of prevention of correct reception because of being largely affected by the parasitic capacitance shown with the broken line. The parasitic capacitance described here is a capacitance generated between the insulating layer 11 or the fixed electrode 11R and the movable portion 1LD positioned so as not to overlap the fixed electrode 11R in a plan view when the width of the movable portion 1RH and the width of the movable portion 1LD are the same as each other.

Accordingly, in the present modification example, the width of the movable portion 1RD is made smaller than the width of the movable portion 1RH in the x-axis direction. In this manner, the variable capacitance between the movable portion 1RD and the fixed electrode 11R and the variable capacitance between the movable portion 1LD and the fixed electrode 11L are equalized to each other in a degree of change, so that the occurrence of the parasitic capacitance can be prevented, and the sensitivity of the acceleration sensor can be improved.

However, in order to make the membrane 1 function as the mass body, it is required to unbalance right- and left-side masses of the entire membrane 1. Therefore, it is required to configure the present modification example so as to include the conductive layer 1DL and the conductive layer 1HL having the movable portion 1RH whose width in the x-axis direction is larger than that of the movable portion 1LH. In other words, the membrane 1 is required to have the stacking structure.

In such a case, each of the torsion spring 2T1 and the torsion spring 2T2 not illustrated can be easily formed with a smaller thickness than that of the membrane 1 by removing the insulating layer 1IL and the conductive layer 1DL on the conductive layer 1HL. In this manner, the effect of the acceleration sensor described with reference to FIGS. 1 to 8 can be obtained, and the sensitivity of the acceleration sensor can be further increased when the width of the movable portion 1RD in the x-axis direction is formed to be the same as the width of the movable portion 1LD in the x-axis direction. Note that this point can be obtained even when the cap layer CL has the fixed electrodes 12L and 12R below the insulating layer 1I as similar to the structure shown in FIG. 3.

Second Embodiment

Figure 10:
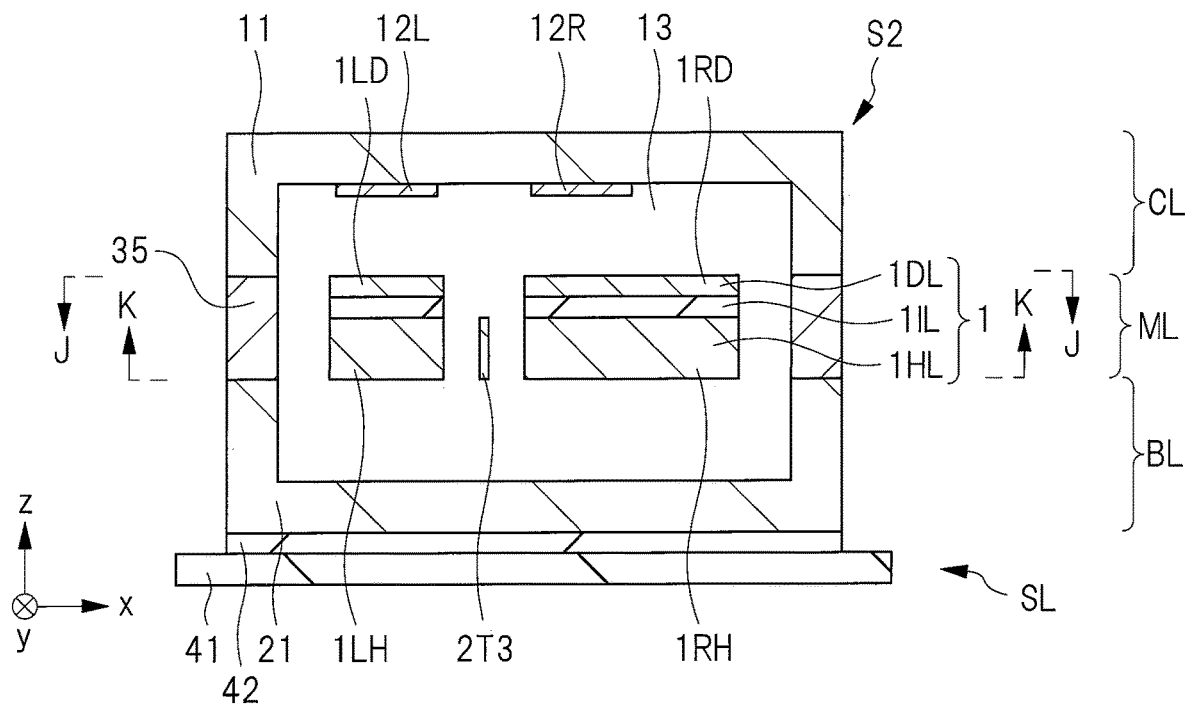
FIG. 10 is a cross-sectional view in a line H-H of each of FIGS. 12 and 13 in a view showing an acceleration sensor according to a present second embodiment.
Figure 11:
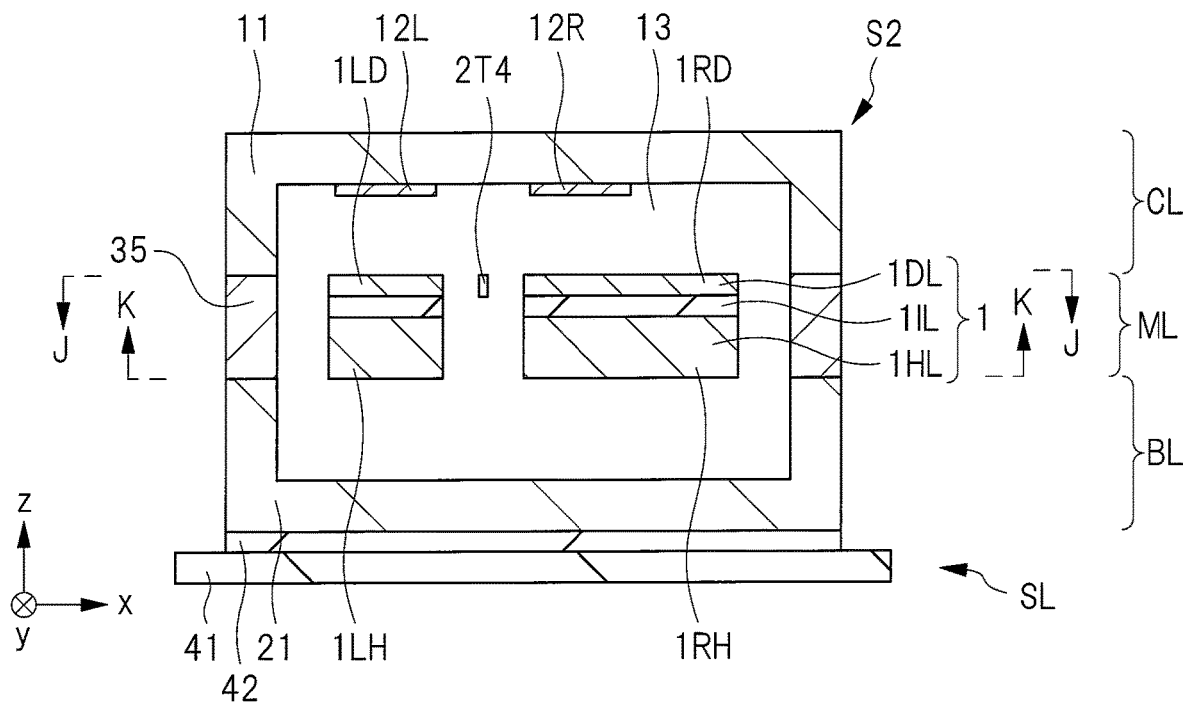
FIG. 11 is a cross-sectional view in a line I-I of each of FIGS. 12 and 13 in the view showing the acceleration sensor according to the present second embodiment.
Figure 12:
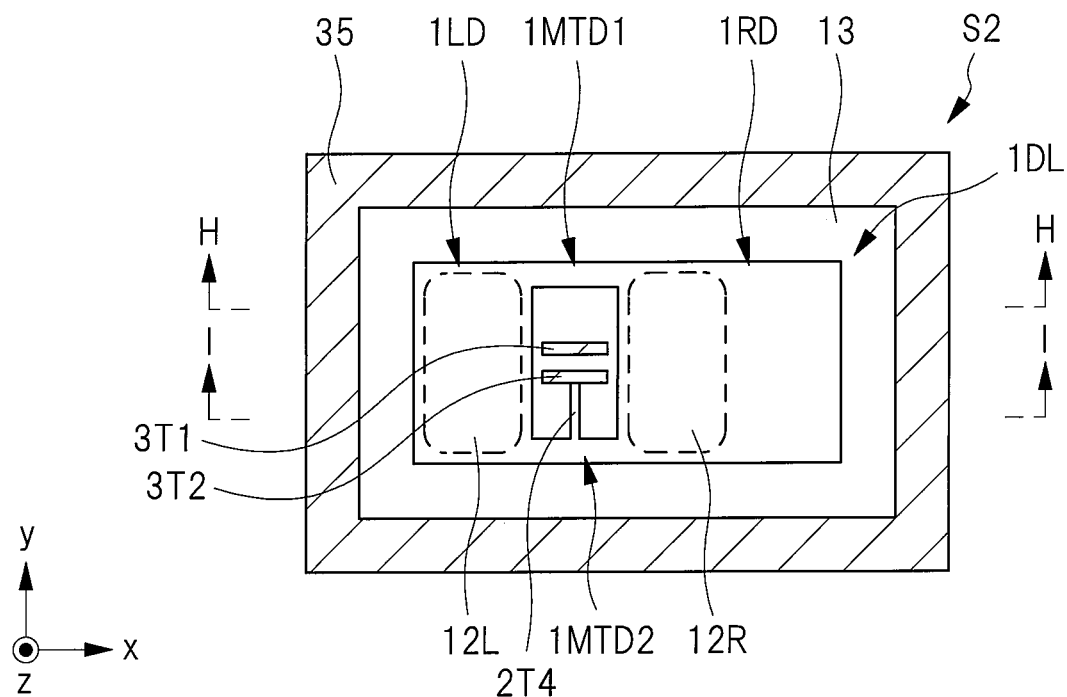
FIG. 12 is a plan view in a line J-J of each of FIGS. 10 and 11 in the view showing the acceleration sensor according to the present second embodiment.
Figure 13:
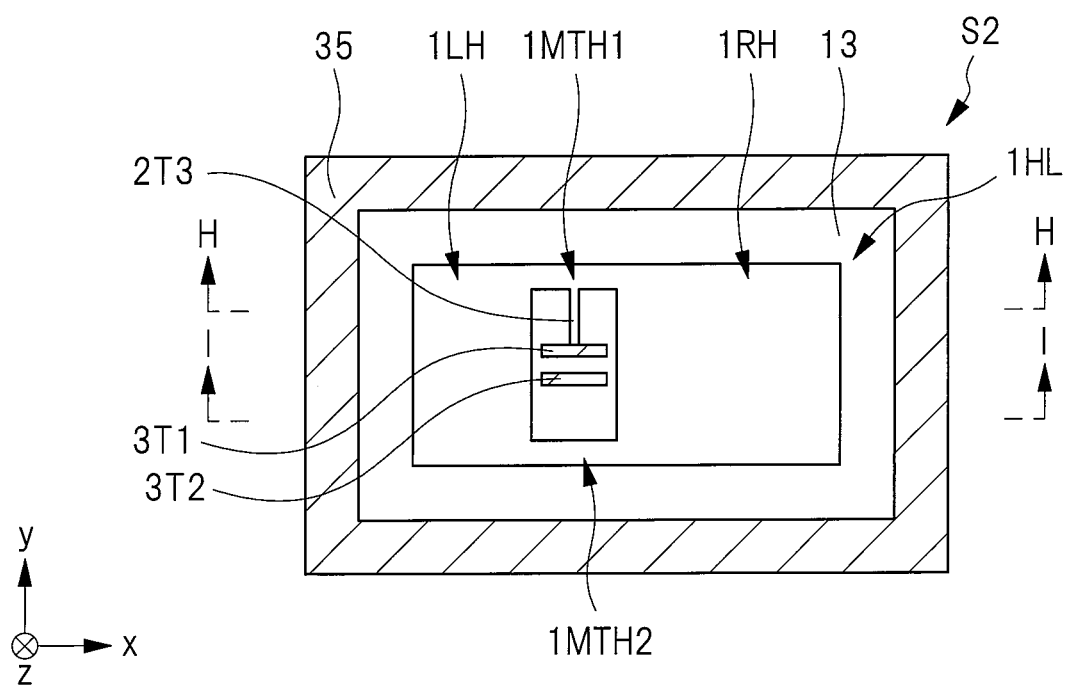
FIG. 13 is a plan view in a line K-K of each of FIGS. 10 and 11 in the view showing the acceleration sensor according to the present second embodiment.

A structure of an acceleration sensor according to the present second embodiment will be described with reference to FIGS. 10 to 13 mainly in differences from the acceleration sensor according to the first embodiment. Each of FIGS. 10 and 11 is a cross-sectional view of the acceleration sensor according to the present second embodiment. Each of FIGS. 12 and 13 is a plan view of the acceleration sensor according to the present second embodiment. FIG. 10 is a cross-sectional view in a line H-H of each of FIGS. 12 and 13. FIG. 11 is a cross-sectional view in a line I-I of each of FIGS. 12 and 13. FIG. 12 is a plan view in a line J-J of each of FIGS. 10 and 11 in a plan view showing the upper surface of the membrane layer. FIG. 13 is a plan view in a line K-K of each of FIGS. 10 and 11 in a plan view showing the lower surface of the membrane layer.

An acceleration sensor S2 according to the present second embodiment is formed of the stacking structure of the base layer BL, the membrane layer ML and the cap layer CL as similar to the acceleration sensor S1 according to the first embodiment, and is mounted on the mounting substrate layer SL.

As shown in FIGS. 10 to 13, the membrane layer ML is formed of a membrane (mass body) 1, a torsion spring 2T3, a spring 2T4, fixed portions 3T1 and 3T2, and a side portion 35. The side portion 35 functions as a side portion closing a hollow 13.

As shown in FIGS. 10 and 13, the torsion spring 2T3 is formed of a conductive layer 1HL. The torsion spring 2T3 has a plate shape that is thin in the x-axis direction (as the width) and long in the y-axis direction (as the length), and functions as the torsion spring that allows torsion motion taking the y axis as a rotary axis. One end of the torsion spring 2T3 is connected to a joint portion 1MTH1 that is a part of the lower layer of the membrane 1, and the other end thereof is connected to the fixed portion 3T1. Therefore, the membrane 1 also has a function that allows the torsion motion taking the y axis as the rotary axis. That is, the torsion spring 2T3 is united with the conductive layer 1HL and the fixed portion 3T1. Further, the torsion spring 2T3 is set to have the length in the y-axis direction and the thickness in the z-axis direction that are larger than the width in the x-axis direction, and therefore, the membrane 1 also has a function that suppresses rotary motion and translatory motion taking the y axis as the rotary axis except for the torsion motion.

The conductive layer 1HL is made of a material having a small resistance value such as a metal or a low resistive silicon. When the movable portions 1LH and 1RH and the torsion spring 2T3 are formed by hollowing a part of the conductive layer 1HL, the thicknesses of the movable portions 1LH and 1RH and the thickness of the torsion spring 2T3 can be equalized with each other, and therefore, the accuracy of the acceleration sensor S2 can be increased.

As shown in FIGS. 11 and 12, the spring 2T4 is formed of the conductive layer 1DL as different from the acceleration sensor S1 according to the first embodiment. It has a bar shape that is larger in (the length in) the y-axis direction than (the width in) the x-axis direction and (the thickness in) the z-axis direction, and functions as the torsion spring that allows torsion motion taking the y axis as a rotary axis. One end of the torsion spring 2T4 is connected to the membrane 1, and the other end thereof is connected to the fixed portion 3T2. Therefore, the acceleration sensor also has a function that allows the torsion motion taking the y axis as the rotary axis with respect to the membrane 1.

In the acceleration sensor S2 according to the present second embodiment, as similar to the torsion spring 2T3, the spring 2T4 has the thickness (in the z-axis direction) larger than the width (in the x-axis direction) and has the length (in the y-axis direction) larger than the thickness (the z-axis direction). Therefore, the spring 2T4 is a torsion spring. Here, as different from the torsion spring 2T3, the spring 2T4 has the small spring constant related to the torsion motion taking the y axis as the rotary axis, and is weak in the function that suppresses the rotary motion and the translatory motion taking the y axis as the rotary axis except for the torsion motion. However, these features do not reject all the purposes of the present invention. This is because the torsion spring 2T3 has these functions. As the second best structure in the structure achieving the acceleration sensor S2 of the present embodiment, the thickness of the spring 2T4 (in the z-axis direction) may be smaller than the width thereof (in the x-axis direction). In order to clarify this feature, the member 2T4 is called not "torsion spring" but "spring" here.

Note that the thickness of the conductive layer 1DL and the thickness of the conductive layer 1HL are almost equalized with each other by thickening the conductive layer 1DL, so that the function that suppresses the rotary motion and the translatory motion taking the y axis as the rotary axis except for the torsion motion can be the strongest. Conversely, when a ratio of the conductive layer 1DL and the conductive layer 1HL in the thickness is set to be larger or smaller than 1, the spring constant of the entire membrane is decreased, and therefore, the length of the beam in the y-axis direction can be decreased, so that the chip size can be downsized.

The conductive layer 1DL is made of a material having a small resistance value such as a metal or a low resistive silicon. When the movable portions 1LD and 1RD and the torsion spring 2T4 are formed by hollowing a part of the conductive layer 1DL, the thicknesses of the movable portions 1LD and 1RD and the thickness of the torsion spring 2T4 can be equalized with each other, and therefore, the accuracy of the acceleration sensor S2 can be increased.

Also in the acceleration sensor S2 according to the present second embodiment, each of the torsion spring 2T3, the spring 2T4 and the fixed portions 3T1 and 3T2 is made of a conductor, and has a function of an electric draw-out line of the movable portion (movable electrode) 1LD or 1RD.

In the acceleration sensor S2 according to the present second embodiment, the torsion spring 2T3 is formed of the conductive layer 1HL as shown in FIGS. 11 and 12, and the spring 2T4 is formed o the conductive layer 1DL as shown in FIGS. 10 and 13. That is, the spring 2T4 is united with the conductive layer 1DL. Therefore, a beam having a smaller spring constant than that of the acceleration sensor S1 according to the first embodiment can be achieved. The sensitivity of the acceleration sensor S2 according to the present second embodiment is set to be the same as that of the acceleration sensor S1 according to the first embodiment, and therefore, the chip size is smaller as shown in FIGS. 12 and 13 than that of the acceleration sensor S1 according to the first embodiment, and the manufacturing cost is reduced. As a result, the highly sensitive acceleration sensor can be provided with a low price.

<Other Effect>

Each purpose of the acceleration sensor S1 according to the first embodiment and the acceleration sensor S2 according to the present second embodiment is to detect the acceleration in the z-axis direction at a high sensitivity. In this case, it is desirable to set a detecting axis to the z axis.

In the acceleration sensor S1 according to the first embodiment, the membrane (mass body) 1 is mainly formed of the conductive layers 1HL and 1DL, and each of the torsion springs 2T1 and 2T2 is formed of the conductive layer 1HL that is the lower layer. Therefore, z-axis coordinates of a torsion center of the torsion springs 2T1 and 2T2 is lower than z-axis coordinates of a center of gravity of the membrane (mass body) 1. Therefore, the detecting axis tilts in the x-axis direction. In other words, a cross-axis sensitivity is poor. In this case, when an external force is applied to the acceleration sensor from the z-axis direction, the vibration can be detected without any problem. However, the membrane seesaws also when an external force is applied to the acceleration sensor from the x-axis direction, and therefore, there is a problem in which the acceleration sensor erroneously detects the vibration in the x-axis direction as the vibration in the z-axis direction.

On the other hand, in the acceleration sensor S2 according to the present second embodiment, the membrane (mass body) 1 is mainly formed of the conductive layers 1HL and 1DL, the torsion spring 2T3 is formed of the conductive layer 1HL, and the spring 2T4 is formed of the conductive layer 1DL. Therefore, the detecting axis is oriented in the z-axis direction. That is, the z-axis coordinates of the center of gravity of the membrane (mass body) 1 are positioned at the same coordinates (height) as the z-axis coordinates of the torsion center of the torsion springs 2T3 and the spring 2T4. In other words, the cross-axis sensitivity is excellent. Therefore, even when an external force is applied to the acceleration sensor S2 from the x-axis direction, the membrane 1 does not move.

In the acceleration sensor S2 according to the present second embodiment, note that the conductive layers 1DL and 1HL have respective opening portions that overlap each other in a plan view, and the fixed portions 3T1 and 3T2 pass insides these opening portions. Here, although not illustrated, an area of the opening portion of the conductive layer 1HL is larger than an area of the opening portion of the conductive layer 1DL, and therefore, the width of the spring 2T4 in the x-axis direction is set to be larger than that of the torsion spring 2T3, so that the detecting axis is correctly matched with the z-axis direction.

The above description will be expressed in other words as follows. That is, the acceleration sensor S2 according to the present second embodiment includes a capacitance detecting acceleration sensor including a membrane having a stacking structure of an upper layer and a lower layer and having a plurality of movable portions, a plurality of fixed portions, and a plurality of beams that join the fixed portions and the membrane and that can twist so that each of the plurality of movable portions is movable in a detecting direction. Each of the beams is a torsion spring having a width that is smaller than a thickness and having a length that is larger than the thickness, a first beam of the plurality of beams is formed of the same layer as the lower layer, and a second beam thereof is formed of the same layer as the upper layer. In this manner, the spring constant of the entire membrane can be decreased, and therefore, the length of the beam in the y-axis direction can be decreased, so that the chip size can be downsized.

In addition, the sensitivity in the x-axis direction orthogonal to the detecting direction can be improved. In other words, an acceleration sensor that is highly sensitive and is excellent in the cross-axis sensitivity can be provided with a low price.

Third Embodiment

Figure 14:
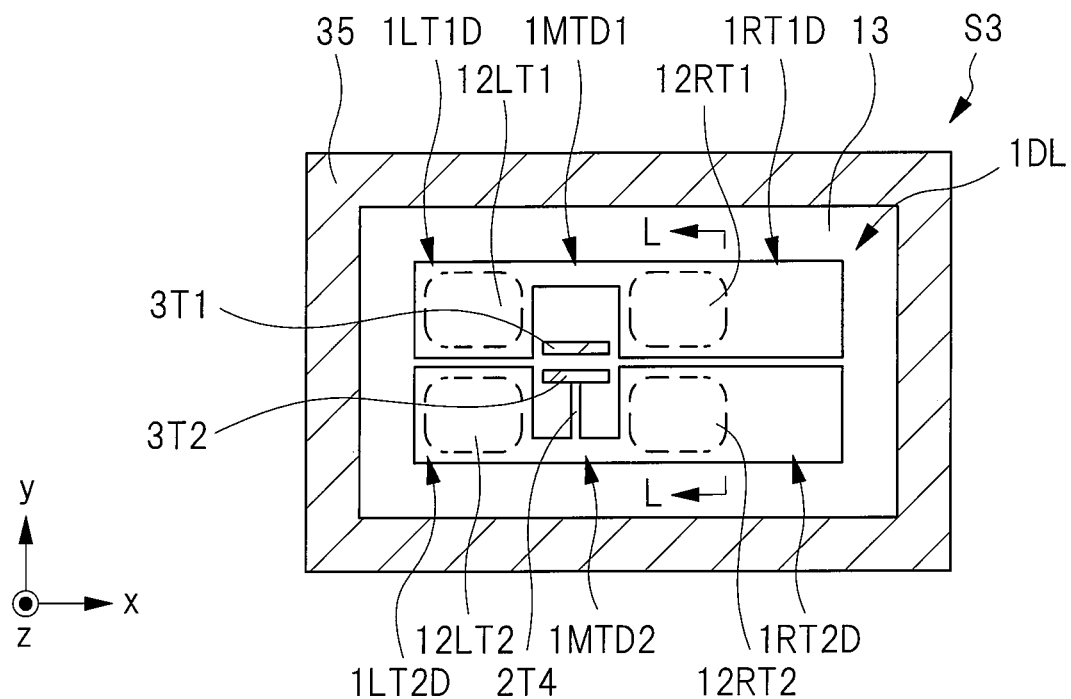
FIG. 14 is a plan view showing an acceleration sensor according to a present third embodiment.
Figure 15:
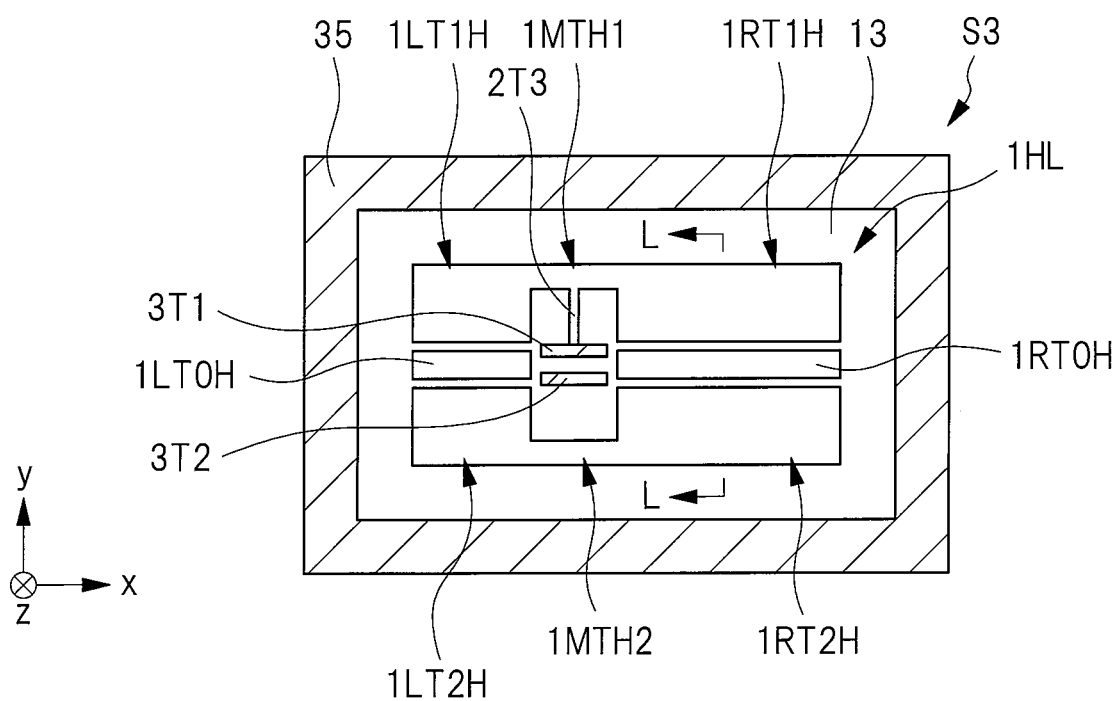
FIG. 15 is a plan view showing the acceleration sensor according to the present third embodiment.
Figure 16:
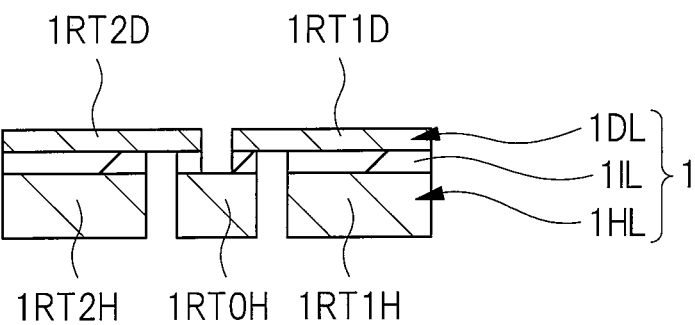
FIG. 16 is a cross-sectional view in a line L-L of FIG. 15 in a view showing the acceleration sensor according to the present third embodiment.

A structure of an acceleration sensor according to the present third embodiment will be described with reference to FIGS. 14 to 16 mainly in differences from the acceleration sensor according to the second embodiment. Each of FIGS. 14 and 15 is a plan view of the acceleration sensor according to the present third embodiment. FIG. 16 is a cross-sectional view of the acceleration sensor according to the present third embodiment. FIG. 14 is a plan view showing the upper surface of the membrane layer of the acceleration sensor according to the present third embodiment. FIG. 15 is a plan view showing the lower surface of the membrane layer of the acceleration sensor according to the present third embodiment. FIG. 16 is a cross-sectional view in a line L-L of FIG. 15.

An acceleration sensor S3 according to the present third embodiment is formed of the stacking of the base layer BL, the membrane layer ML and the cap layer CL as similar to the acceleration sensor S2 according to the second embodiment, and is mounted on the mounting substrate layer SL (see FIG. 2).

As shown in FIGS. 14 and 15, the membrane layer ML is formed of a membrane (mass body) 1 (see FIG. 2), a torsion spring 2T3, a spring 2T4, fixed portions 3T1 and 3T2, and a side portion 35. As similar to the acceleration sensor S2 according to the second embodiment, the torsion spring 2T3 is formed of a conductive layer 1HL, and the soring 2T4 is formed of a conductive layer 1DL. The membrane is formed of the conductive layer 1DL, the insulating layer 1IL and the conductive layer 1HL. Also in this case, the conductive layer 1HL is thicker than the conductive layer 1DL.

The conductive layer 1DL is formed of movable portions 1LT1D, 1RT1D, 1LT2D and 1RT2D, a joint portion 1MTD1 that mechanically and electrically connecting the movable portion 1LT1D and the movable portion 1RT1D, and a joint portion 1MTD2 that mechanically and electrically connecting the movable portion 1LT2D and the movable portion 1RT2D.

The conductive layer 1HL includes movable portions 1LT1H, 1RT1H, 1LT2H and 1RT2H, a joint portion 1MTH1 that mechanically and electrically connecting the movable portion 1LT1H and the movable portion 1RT1H, and a joint portion 1MTH2 that mechanically and electrically connecting the movable portion 1LT2H and the movable portion 1RT2H. The conductive layer 1HL further includes a mechanical joint portion 1LT0H that electrically insulates but mechanically joins the movable portion (movable electrode) 1LT1D and the movable portion (movable electrode) 1LT2D and a mechanical joint portion 1RT0H that electrically insulates but mechanically joins the movable portion (movable electrode) 1RT1D and the movable portion (movable electrode) 1RT2D.

All the components of the conductive layer 1DL (that are the movable portions 1LT1D, 1RT1D, 1LT2D and 1RT2D, and the joint portions 1MTD1 and 1MTD2) and the components of the conductive layer 1HL (that are the movable portions 1LT1H, 1RT1H, 1LT2H and 1RT2H, the joint portions 1MTH1 and 1MTH2, and the mechanical joint portions 1LT0H and 1RT0H) are mechanically united with one another as a single membrane. That is, these components are fixed to one another.

The movable portions 1LT1D and 1RT1D are paired with the fixed electrodes 12LT1 and 12RT1 formed in the cap layer CL to function as movable electrodes of variable capacitances. The movable portions 1LT1H and 1RT1H function as reinforcing members that increase a mechanical strength of the membrane.

The movable portions 1LT2D and 1RT2D are paired with the fixed electrodes 12LT2 and 12RT2 formed in the cap layer CL to function as movable electrodes of variable capacitances. The movable portions 1LT2H and 1RT2H function as reinforcing members that enhance the mechanical strength of the membrane.

The movable portion (movable electrode) 1LT1D and the movable portion (movable electrode) 1RT1D are electrically connected to each other by the joint portion 1MTD1 between them. The movable portion (movable electrode) 1LT2D and the movable portion (movable electrode) 1RT2D are electrically connected to each other by the joint portion 1MTD2 between them. On the other hand, the movable portions (movable electrodes) 1LT1D, 1RT1D and the movable portions (movable electrodes) 1LT2D, 1RT2D are separated and electrically insulated from each other. In other words, the movable portions 1LT1D, 1RT1D and the movable portions 1LT2D, 1RT2D are separated from each other in terms of a direct current. That is, a capacitance element formed of each of the movable portions 1LT1D and 1RT1D and a capacitance element formed of each of the movable portions 1LT2D and 1RT2D may be connected to each other.

Also in the acceleration sensor S3 according to the present third embodiment, each of the torsion spring 2T3, the spring 2T4 and the fixed portions 3T1 and 3T2 is made of a conductor. Therefore, the torsion spring 2T3 and the fixed portion 3T1 have functions of electric draw-out lines of the movable portions (movable electrodes) 1LT1D and 1RT1D. The spring 2T4 and the fixed portion 3T2 have functions of electric draw-out lines of the movable portions (movable electrodes) 1LT2D and 1RT2D.

As shown in FIG. 16, the conductive layers 1DL and 1HL are mechanically connected to each other by the insulating layer 1IL between them. The insulating layer 1IL is removed on each of regions between the movable portion 1RT2H and the mechanical joint portion 1RT0H that are adjacent to each other and between the movable portion 1RT1H and the mechanical joint portion 1RT0H that are adjacent to each other. And, the insulating layer 1IL is removed below a region between the movable portions 1RT1D and 1RT2D that are adjacent to each other. The movable portions 1RT1D and 1RT2D that are separated from each other are fixed to each other by the mechanical joint portion 1RT0H formed below these movable portions through the insulating layer 1IL. That is, when one membrane has the movable electrodes that are insulated from each other as described in the present embodiment, it is required to form the membrane having the stacking structure because a supporting layer that fixes these movable electrodes separated from each other to the membrane is required.

Also in the acceleration sensor S3 according to the present third embodiment, the torsion spring 2T3 is formed of the conductive layer 1HL as shown in FIG. 15, and the spring 2T4 is formed of the conductive layer 1DL as shown in FIG. 14. Therefore, the beam having the smaller spring constant than that of the acceleration sensor S1 can be achieved. As similar to the acceleration sensor S2 according to the second embodiment, the chip size is even smaller than that of the acceleration sensor S1 according to the first embodiment, and the manufacturing cost is reduced. As a result, the highly sensitive acceleration sensor can be provided with a low price. And, since the torsion spring 2T3 is formed of the conductive layer 1HL and the spring 2T4 is formed of the conductive layer 1DL, the detecting axis is oriented in the z-axis direction. In other words, the cross-axis sensitivity is excellent.

The acceleration sensor S3 according to the present third embodiment is formed of four variable capacitances (two independent variable capacitance pairs). Therefore, by electric connection of a first embodiment in International Publication No. WO2017/009885, the sensitivity of the acceleration sensor can be doubled.

Fourth Embodiment

Figure 17:
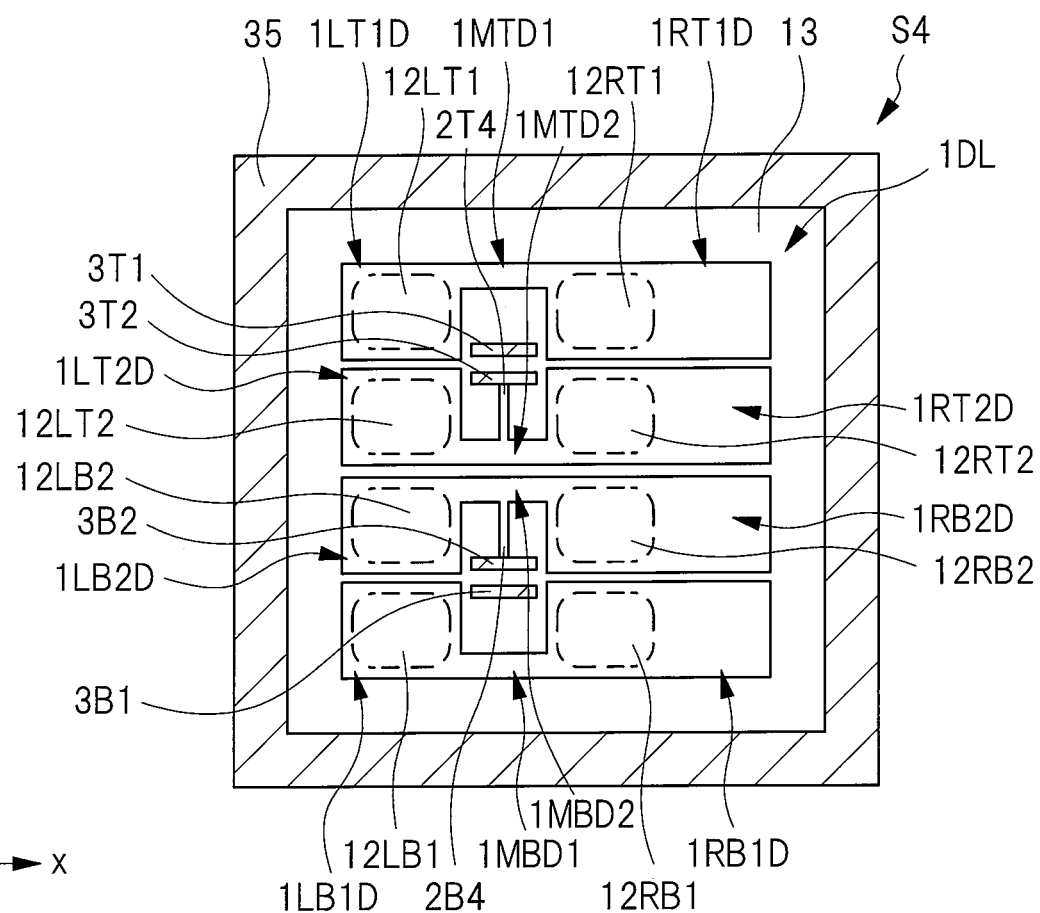
FIG. 17 is a plan view showing an acceleration sensor according to a present fourth embodiment.
Figure 18:
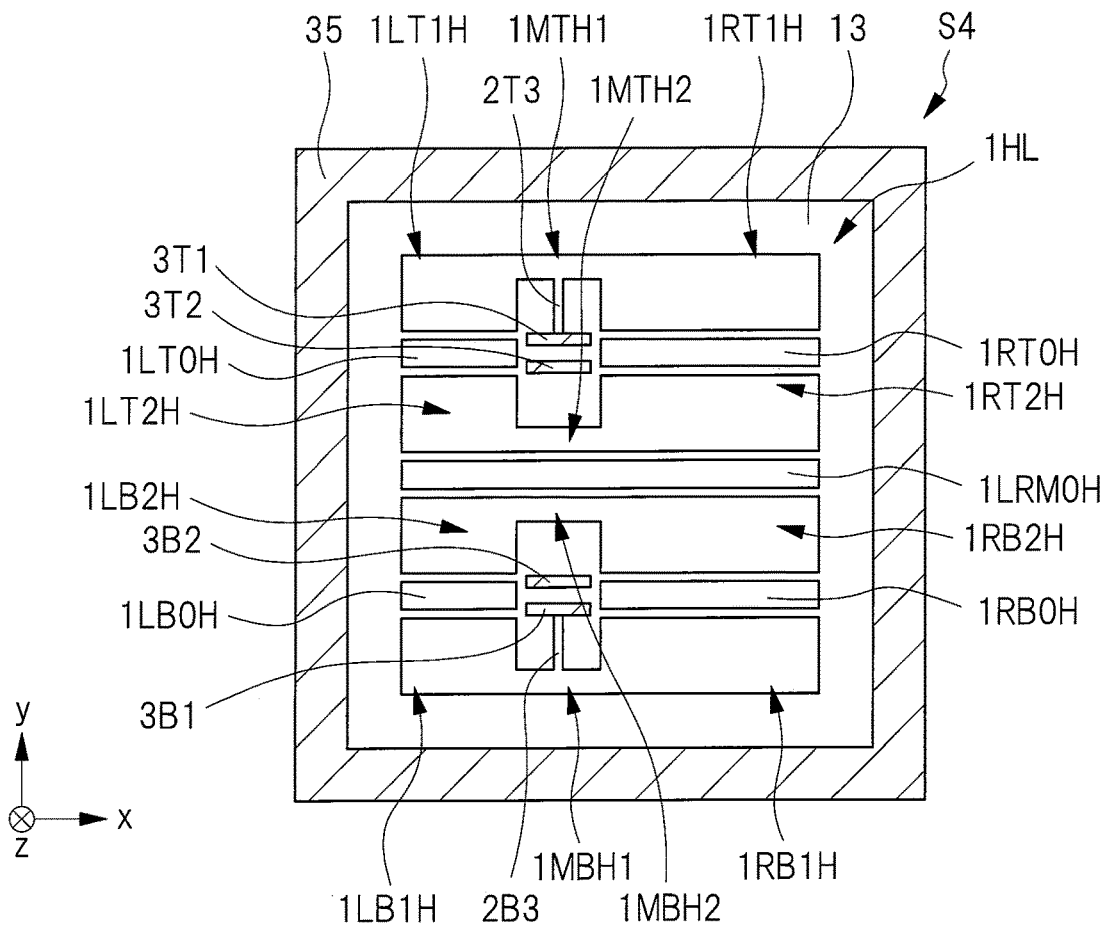
FIG. 18 is a plan view showing the acceleration sensor according to the present fourth embodiment.

A structure of an acceleration sensor according to the present fourth embodiment will be described with reference to FIGS. 17 and 18 mainly in differences from the acceleration sensor according to the third embodiment. Each of FIGS. 17 and 18 is a plan view of the acceleration sensor according to the fourth embodiment. FIG. 17 is a plan view showing an upper surface of a membrane layer of the acceleration sensor according to the present fourth embodiment. FIG. 18 is a plan view showing a lower surface of the membrane layer of the acceleration sensor according to the present fourth embodiment.

An acceleration sensor S4 according to the present fourth embodiment is formed of the stacking of the base layer BL, the membrane layer ML and the cap layer CL as similar to the acceleration sensor S3 according to the third embodiment, and is mounted on the mounting substrate layer SL (see FIG. 2).

As shown in FIGS. 17 and 18, the membrane layer ML is formed of a membrane (mass body) 1 (see FIG. 2), torsion springs 2T3 and 2B3, springs 2T4 and 2B4, fixed portions 3T1, 3T2, 3B1 and 3B2, and a side portion 35. The membrane is formed of a conductive layer 1DL, an insulating layer 1IL and a conductive layer 1HL. As similar to the acceleration sensor S3 according to the third embodiment, the torsion spring 2T3 is formed of the conductive layer 1HL, and the soring 2T4 is formed of the conductive layer 1DL. The membrane of the acceleration sensor S4 according to the present fourth embodiment has a structure in which two membranes of the acceleration sensor S3 according to the third embodiment are symmetrically arranged in a vertical direction. Therefore, the torsion spring 2B3 is formed of the conductive layer 1HL, and the spring 2B4 is formed of the conductive layer 1DL. Also in this case, the conductive layer 1HL is thicker than the conductive layer 1DL.

The conductive layer 1DL includes movable portions 1LT1D, 1RT1D, 1LT2D, 1RT2D, 1LB1D, 1RB1D, 1LB2D, 1RB2D. Further, the conductive layer 1DL includes a joint portion 1MTD1 that mechanically and electrically connects the movable portions 1LT1D and 1RT1D, a joint portion 1MTD2 that mechanically and electrically connects the movable portions 1LT2D and 1RT2D, a joint portion 1MBD1 that mechanically and electrically connects the movable portions 1LB1D and 1RB1D, and a joint portion 1MBD2 that mechanically and electrically connects the movable portions 1LB2D and 1RB2D.

The conductive layer 1HL includes movable portions 1LT1H, 1RT1H, 1LT2H, 1RT2H, 1LB1H, 1RB1H, 1LB2H and 1RB2H. And, the conductive layer 1HL includes a joint portion 1MTH1 that mechanically and electrically connects the movable portions 1LT1H and 1RT1H, a joint portion 1MTH2 that mechanically and electrically connects the movable portions 1LT2H and 1RT2H, a joint portion 1MBH1 that mechanically and electrically connects the movable portions 1LB1H and 1RB1H, and a joint portion 1MBH2 that mechanically and electrically connects the movable portions 1LB2H and 1RB2H. In addition, the conductive layer 1HL includes a mechanical joint portion 1LT0H that electrically insulates but mechanically joins the movable portion (movable electrode) 1LT1D and the movable portion (movable electrode) 1LT2D and a mechanical joint portion 1RT0H that electrically insulates but mechanically joins the movable portion (movable electrode) 1RT1D and the movable portion (movable electrode) 1RT2D. Further, the conductive layer 1HL includes a mechanical joint portion 1LB0H that electrically insulates but mechanically joins the movable portion (movable electrode) 1LB1D and the movable portion (movable electrode) 1LB2D and a mechanical joint portion 1RB0H that electrically insulates but mechanically joins the movable portion (movable electrode) 1RB1D and the movable portion (movable electrode) 1RB2D. Still further, the conductive layer 1HL includes a mechanical joint portion 1LRM0H that electrically insulates but mechanically joins two membranes that are shown on upper and lower sides of FIG. 18.

All the components of the conductive layer 1DL (that are the movable portions 1LT1D, 1RT1D, 1LT2D, 1RT2D, 1LB1D, 1RB1D, 1LB2D and 1RB2D and the joint portions 1MTD1, 1MTD2, 1MBD1 and 1MBD2) and the components of the conductive layer 1HL (that are the movable portions 1LT1H, 1RT1H, 1LT2H, 1RT2H, 1LB1H, 1RB1H, 1LB2H and 1RB2H, the joint portions 1MTH1, 1MTH2, 1MBH1 and 1MBH2, and the mechanical joint portions 1LT0H, 1RT0H, 1LB0H, 1RB0H and 1LRM0H) are mechanically united with one another.

The movable portions 1LT1D and 1RT1D are separated but insulated from each other, the movable portions 1LT2D and 1RT2D are separated but insulated from each other, the movable portions 1LB1D and 1RB1D are separated but insulated from each other, and the movable portions 1LB2D and 1RB2D are separated but insulated from each other. That is, the movable portions 1LT1D and 1RT1D are separated from each other in terms of a direct current, the movable portions 1LT2D and 1RT2D are separated from each other in terms of a direct current, the movable portions 1LB1D and 1RB1D are separated from each other in terms of a direct current, and the movable portions 1LB2D and 1RB2D are separated from each other in terms of a direct current.

The movable portions 1LT1D and 1RT1D are paired with the fixed electrodes 12LT1 and 12RT1 formed in the cap layer CL (see FIG. 2) to function as movable electrodes of variable capacitances. The movable portions 1LT2D and 1RT2D are paired with the fixed electrodes 12LT2 and 12RT2 formed in the cap layer CL to function as movable electrodes of variable capacitances. Each of the movable portions 1LT1H, 1RT1H, 1LT2H and 1RT2H functions as a reinforcing member that enhances the mechanical strength of the membrane.

The movable portions 1LB1D and 1RB1D are paired with the fixed electrodes 12LB1 and 12RB1 formed in the cap layer CL to function as movable electrodes of variable capacitances. The movable portions 1LB2D and 1RB2D are paired with the fixed electrodes 12LB2 and 12RB2 formed in the cap layer CL to function as movable electrodes of variable capacitances. Each of the movable portions 1LB1H, 1RB1H, 1LB2H and 1RB2H functions as a reinforcing member that enhances the mechanical strength of the membrane.

Also in the acceleration sensor S4 according to the present fourth embodiment, each of the torsion springs 2T3 and 2B3, the springs 2T4 and 2B4, and the fixed portions 3T1, 3T2, 3B1 and 3B2 is made of a conductor. Therefore, the torsion spring 2T3 and the fixed portion 3T1 have functions of electric draw-out lines of the movable portions (movable electrodes) 1LT1D and 1RT1D. The spring 2T4 and the fixed portion 3T2 have functions of electric draw-out lines of the movable portions (movable electrodes) 1LT2D and 1RT2D. Similarly, the torsion spring 2B3 and the fixed portion 3B1 have functions of electric draw-out lines of the movable portions (movable electrodes) 1LB1D and 1RB1D. The spring 2B4 and the fixed portion 3B2 have functions of electric draw-out lines of the movable portions (movable electrodes) 1LB2D and 1RB2D.

In the acceleration sensor S4 according to the present fourth embodiment, each of two springs of the four springs (beams) is formed of the conductive layer 1HL, and each of the other two springs thereof is formed of the conductive layer 1DL. Therefore, as similar to the acceleration sensor S2 according to the second embodiment, the detecting axis is oriented in the z-axis direction. In other words, the cross-axis sensitivity is excellent. And, as different from the acceleration sensor S3 according to the third embodiment, the spring formed of the conductive layer 1DL and the spring formed of the conductive layer 1HL are symmetric to each other in the y-axis direction, and therefore, the cross-axis sensitivity in the y-axis direction is excellent. In other words, the spring formed of the conductive layer 1DL and the spring formed of the conductive layer 1HL are linearly symmetric to each other with respect to the x axis.

That is, a first beam and a fourth beam formed in the same layer as the lower layer of the membrane having the stacking structure are arranged outside of a second beam and a third beam formed in the same layer as the upper layer of the membrane in a plan view. Conversely, even when the second beam and the third beam formed in the same layer as the upper layer of the membrane are arranged outside of the first beam and the fourth beam formed in the same layer as the lower layer of the membrane in a plan view, an acceleration sensor that is excellent in the cross-axis sensitivity in the y axis can be achieved.

When the torsion spring is arranged at a position that is away from a center of the membrane on an x-y plane, the function that suppresses the rotary motion and the translatory motion taking the y axis as the rotary axis except for the torsion motion is enhanced. In the acceleration sensor S4 according to the present fourth embodiment, the conductive layer 1HL is formed to be thicker than the conductive layer 1DL, and each of the outer torsion springs 2T3 and 2B3 is formed of the conductive layer 1HL. Therefore, in the acceleration sensor S4, the rotary motion and the translatory motion taking the y axis as the rotary axis except for the torsion motion can be suppressed.

When the acceleration sensor has four electrodes that are electrically insulated from one another on the upper surface of the membrane as described in the present embodiment, it is required to provide four beams (springs) that function as the electric draw-out lines. The spring constant of the entire membrane is increased by increase in the number of beams, and therefore, it is required to decrease the spring constant of each beam. If the beam is extended in the y-axis direction in order to decrease the spring constant, the increase in the chip size also becomes remarkable because of the large number of beams.

In the present embodiment, each beam is formed of the conductive layer 1HL or the conductive layer 1DL, so that the spring constant can be decreased while the short length of each beam is maintained. In this case, four beams can be formed on a small chip, and the membrane of the acceleration sensor S4 can be formed of eight variable capacitances (four independent variable capacitance pairs). That is, the number of electric connections can be twice that of the acceleration sensor S3 according to the third embodiment, and therefore, the sensitivity of the acceleration sensor S4 can be four times that of the same.

The above-described points will be expressed in other words as follows. That is, a capacitance detecting acceleration sensor is provided, the capacitance detecting acceleration sensor including: the membrane having the stacking structure having the upper layer and the lower layer and having the plurality of movable portions; the plurality of fixed portion; and a plurality of beams that join the fixed portions and the membrane and that can twist so that each of the plurality of movable portions is movable in the detecting direction. Each of the beams is the torsion spring having the width that is smaller than the thickness and having the length that is larger than the thickness, each of the first beam and the fourth beam of the plurality of beams is formed of the same layer as the lower layer, and each of the second beam and the third beam thereof is formed of the same layer as the upper layer. In this manner, the spring constant in the entire membrane can be decreased, and therefore, the length of each beam in the y-axis direction can be decreased, so that three or more independent capacitance pairs can be formed without increasing the chip size, and besides, the sensitivity can be improved. In addition, sensitivities in the x-axis direction and the y-axis direction that are orthogonal to the detecting direction can be improved. In other words, an acceleration sensor that is highly sensitive and is excellent in the cross-axis sensitivity can be provided with a low price.

The acceleration sensor S4 according to the present fourth embodiment is formed of eight variable capacitances (four independent variable capacitance pairs). Therefore, by the electric connection of an eighth embodiment in International Publication No. WO2017/009885 while the variable capacitances are used for a direct-current voltage applying servo capacitance element and an alternate-current voltage applying servo capacitance element, a highly-sensitive and low-noise acceleration sensor can be achieved.

The servo capacitance elements are elements each also called closed-loop controlling operation unit having fixed electrodes separated from each other on the membrane and movable electrodes in the upper layer forming the membrane as similar to the capacitance elements described in the first to third embodiments. In this case, the movable electrode in the upper layer forming the membrane is called servo electrode. The servo electrode is an electrode to which a voltage is applied in order to suppress the seesawing of the membrane. In the servo capacitance element, a vibration acceleration can be detected by measuring the voltage applied to the servo electrode. Since the membrane can be suppressed from vibrating in the servo capacitance element, the membrane can be prevented from colliding with the fixed portion (pillar) or the container (outer frame), so that the acceleration can be measured even when large vibration occurs.

In the present embodiment, it is considered that, for example, the capacitance elements formed of the respective movable portions 1LT1D, 1RT1D, 1LB1D and 1RB1D, that is, four capacitance elements positioned on both ends of the membrane in the y-axis direction as shown in FIG. 17 are used as the capacitance elements for the vibration detection. In this case, the capacitance elements formed of the respective movable portions 1LT2D, 1RT2D, 1LB2D and 1RB2D, that is, four capacitance elements positioned at the center of the membrane in the y-axis direction as shown in FIG. 17 are used as the servo capacitance elements. At this time, the movable portions 1LT2D, 1RT2D, 1LB2D and 1RB2D that are the electrodes of the servo capacitance elements may be electrically connected to one another. That is, the movable portions 1LT2D and 1RT2D and the movable portions 1LB2D and 1RB2D may be united with each other.

In the foregoing, the invention made by the present inventors has been concretely described on the basis of the embodiments. However, it is needless to say that the present invention is not limited to the foregoing embodiments, and various modifications and alterations can be made within the scope of the present invention.

For example, as described in the modification example (see FIG. 9) of the first embodiment, the widths of the right and left movable electrodes formed of the conductive layer 1HL in the upper layer of the membrane of the second to fourth embodiments may be equalized to each other.

The invention claimed is:

1. An acceleration sensor of a capacitance detecting type, comprising:
    a membrane having a stacking structure including an upper layer and a lower layer and having a plurality of movable portions;
    a plurality of fixed portions; and
    a plurality of beams configured to twist so that each of the plurality of movable portions is movable in a detecting direction,
    wherein the membrane is connected to the fixed portions through the beams,
    wherein each of the beams is a torsion spring having a width that is smaller than a thickness and having a length that is larger than the thickness,
    wherein a first beam of the plurality of beams is formed within the same layer as either the upper layer or the lower layer, and a second beam thereof is formed within the same layer as either the upper layer or the lower layer,
    wherein each of the first beam and a fourth beam of the plurality of beams is formed within the same layer as the lower layer, and each of the second beam and a third beam thereof is formed within the same layer as the upper layer.

2. The acceleration sensor according to claim 1, wherein the plurality of movable portions are electrically separated to be insulated from each other.

3. The acceleration sensor according to claim 1, wherein the lower layer is thicker than the upper layer, and
the first beam and the fourth beam are arranged outside of the second beam and the third beam.

4. The acceleration sensor according to claim 1, wherein the plurality of beams are arranged side by side in a first direction, and
a first electrode and a second electrode form respectively different variable capacitance elements, which are formed of the upper layers of two movable portions, of the plurality of moveable portions, that are disposed side by side in a second direction orthogonal to the first direction so as to sandwich the plurality of beams.

5. The acceleration sensor according to claim 4, wherein a width of the first electrode in the second direction is smaller than a width of the lower layer in the second direction right below the first electrode.

6. The acceleration sensor according to claim 1, wherein an insulating layer interposes between the upper layer and the lower layer.

7. The acceleration sensor according to claim 1, wherein the lower layer is thicker than the upper layer, and
each of both the first beam and the second beam is formed of the lower layer.

* * * * *